US012563912B2

(12) United States Patent
    Kuwabara

(10) Patent No.:　　US 12,563,912 B2
(45) Date of Patent:　　Feb. 24, 2026

(54) LIGHT-EMITTING ELEMENT, LIGHT-EMITTING DEVICE, PHOTOELECTRIC CONVERSION DEVICE, AND ELECTRONIC DEVICE

(71) Applicant: CANON KABUSHIKI KAISHA, Tokyo (JP)

(72) Inventor: Hideshi Kuwabara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 734 days.

(21) Appl. No.: 17/718,439

(22) Filed: Apr. 12, 2022

(65) Prior Publication Data

US 2022/0328605 A1　　Oct. 13, 2022

(30) Foreign Application Priority Data

Apr. 13, 2021　(JP) ................................. 2021-057695

(51) Int. Cl.
*H05B 33/04*　　　(2006.01)
*H01L 27/32*　　　(2006.01)
(Continued)

(52) U.S. Cl.
CPC ......... *H10K 59/123* (2023.02); *H10K 50/813* (2023.02); *H10K 50/852* (2023.02);
(Continued)

(58) Field of Classification Search
CPC .... H10K 59/131; H10K 50/81; H10K 50/856; H10K 59/60; H10K 2102/103;
(Continued)

(56) References Cited

U.S. PATENT DOCUMENTS 7,187,006 B2 *　3/2007　Hayashi ............... H10K 59/873
　　　　　　　　　　　　　　　　　　　　　257/79
8,890,124 B2　11/2014　Koshihara
(Continued)

FOREIGN PATENT DOCUMENTS

CN　　　104979371 A　10/2015
JP　　2012-212622 A　11/2012
(Continued)

OTHER PUBLICATIONS

Oct. 29, 2024 Japanese Official Action in Japanese Patent Appln. No. 2021-067695.

*Primary Examiner* — Ajay Ojha
*Assistant Examiner* — Tsz K Chiu
(74) *Attorney, Agent, or Firm* — Venable LLP

(57)　　　　　　ABSTRACT

The present disclosure provides a light-emitting element having an emission region and a contact region. In the emission region the light-emitting element has, a wiring layer, an interlayer insulating layer, a reflective layer, an optical adjustment layer, a first electrode, a light-emitting layer, and a second electrode, in this order from a substrate side; and in the contact region has, the wiring layer, a conductor, the first electrode, the light-emitting layer, and the second electrode, in this order from the substrate side. The conductor is electrically connected to both the first electrode and the wiring layer. A shortest distance between the first electrode and the substrate in the contact region is equal to or greater than a shortest distance between the reflective layer and the substrate in the emission region.

18 Claims, 24 Drawing Sheets

(51) Int. Cl.

| | | |
|---|---|---|
| *H10K 50/813* | (2023.01) | |
| *H10K 50/852* | (2023.01) | |
| *H10K 50/856* | (2023.01) | |
| *H10K 59/123* | (2023.01) | |
| *H10K 59/131* | (2023.01) | |
| *H10K 59/60* | (2023.01) | |
| *H10K 102/10* | (2023.01) | |

(52) U.S. Cl.

CPC ......... *H10K 50/856* (2023.02); *H10K 59/131* (2023.02); *H10K 59/60* (2023.02); *H10K 2102/103* (2023.02)

(58) Field of Classification Search

CPC .. H10K 50/813; H10K 50/852; H10K 59/123; H10K 59/38; H10K 59/122; H10K 59/80515; H10K 2102/3026; H10K 59/124; H10K 59/1201; H10K 59/878; H10K 2102/351; H10K 50/11; H10K 59/80518; H10K 59/353; H10K 59/876; H10K 50/15; H10K 59/35; H10K 71/00; H10K 59/80521; H10K 59/879; H10K 59/8792; H10K 50/13; H10K 59/12; H10K 59/80522; H10K 59/80524; H10K 2102/341; H10K 50/818; H10K 59/121; H10K 59/126; H10K 59/873; H10K 2102/302; H10K 39/32; H10K 59/1213; H10K 59/30; H10K 59/65; H10K 59/80516; H10K 50/00; H10K 50/824; H10K 50/844; H10K 50/858; H10K 59/00; H10K 59/1315; H10K 2101/10; H10K 30/81; H10K 50/131; H10K 50/16; H10K 50/17; H10K 50/814; H10K 59/179; H10K 59/86; H10K 59/87; H10K 59/871; H10K 59/8722; H10K 59/8731; H10K 59/8794; H10K 71/60; H10K 50/10; H10K 50/115; H10K 50/19; H10K 50/805; H10K 50/82; H10K 50/822; H10K 50/828; H10K 50/84; H10K 50/8426; H10K 50/8428; H10K 50/854; H10K 50/865; H10K 50/87; H10K 59/173; H10K 59/352; H10K 59/80523; H10K 59/82; H10K 59/84; H10K 59/8723; H10K 59/877; H10K 59/88; H10K 71/135; H10K 71/621

See application file for complete search history.

(56) References Cited

U.S. PATENT DOCUMENTS

| | | | | |
|---|---|---|---|---|
| 9,093,408 | B2 | 7/2015 | Koshihara | |
| 9,111,881 | B2 * | 8/2015 | Hanamura | H10K 59/38 |
| 9,142,599 | B2 | 9/2015 | Koshihara | |
| 9,443,919 | B2 | 9/2016 | Koshihara | |
| 10,074,708 | B2 | 9/2018 | Koshihara | |
| 10,468,462 | B2 * | 11/2019 | Akagawa | H10K 59/38 |
| 10,714,555 | B2 | 7/2020 | Koshihara | |
| 11,374,077 | B2 | 6/2022 | Koshihara | |
| 11,557,637 | B2 | 1/2023 | Koshihara | |
| 11,895,871 | B2 | 2/2024 | Koshihara | |
| 12,047,761 | B2 * | 7/2024 | Bok | G06F 3/0443 |
| 2010/0124044 | A1 * | 5/2010 | Kato | B82Y 40/00 |
| | | | | 264/405 |
| 2012/0070942 | A1 * | 3/2012 | Fedorovskaya | C23C 16/405 |
| | | | | 257/E21.502 |
| 2012/0261684 | A1 | 10/2012 | Koshihara | |
| 2014/0117334 | A1 * | 5/2014 | Nakamura | H10K 50/841 |
| | | | | 257/40 |
| 2014/0145164 | A1 * | 5/2014 | Odaka | H10K 59/8794 |
| | | | | 257/40 |
| 2014/0231778 | A1 | 8/2014 | Koshihara | |
| 2015/0060807 | A1 * | 3/2015 | Koshihara | H10K 50/856 |
| | | | | 257/40 |
| 2015/0108446 | A1 * | 4/2015 | Ando | H10K 59/352 |
| | | | | 438/34 |
| 2015/0155346 | A1 * | 6/2015 | Motoyama | H10K 50/865 |
| | | | | 257/89 |
| 2015/0263308 | A1 * | 9/2015 | Park | H10K 59/87 |
| | | | | 438/34 |
| 2015/0349038 | A1 | 12/2015 | Koshihara | |
| 2016/0233284 | A1 * | 8/2016 | Hanamura | H10K 59/12 |
| 2016/0351647 | A1 | 12/2016 | Koshihara | |
| 2017/0229676 | A1 * | 8/2017 | Shiratori | H10K 50/81 |
| 2017/0287955 | A1 * | 10/2017 | Ukigaya | H01L 27/1463 |
| 2017/0317117 | A1 * | 11/2017 | Ukigaya | H01L 27/14645 |
| 2017/0323787 | A1 * | 11/2017 | Kuwabara | H01L 31/20 |
| 2018/0062116 | A1 * | 3/2018 | Park | H10K 59/876 |
| 2018/0212198 | A1 * | 7/2018 | Inoue | H10K 59/124 |
| 2018/0219170 | A1 * | 8/2018 | Kato | H05B 33/24 |
| 2018/0269267 | A1 * | 9/2018 | Ohchi | H10K 50/852 |
| 2019/0013368 | A1 * | 1/2019 | Chung | H10K 59/40 |
| 2019/0013376 | A1 | 1/2019 | Koshihara | |
| 2019/0043934 | A1 * | 2/2019 | Ukigaya | H10K 59/353 |
| 2019/0181202 | A1 * | 6/2019 | Lim | H10K 50/19 |
| 2019/0237626 | A1 * | 8/2019 | Yoon | H10H 20/841 |
| 2020/0295109 | A1 | 9/2020 | Koshihara | |
| 2021/0020868 | A1 | 1/2021 | Ikeda | |
| 2021/0366900 | A1 * | 11/2021 | Kaneda | H01L 21/26513 |
| 2022/0130924 | A1 * | 4/2022 | Takahashi | H10K 59/38 |
| 2022/0131110 | A1 * | 4/2022 | Ishizuya | H10K 59/876 |
| 2022/0278184 | A1 | 9/2022 | Koshihara | |
| 2022/0406866 | A1 | 12/2022 | Koshihara | |
| 2023/0189557 | A1 * | 6/2023 | Takahashi | H10K 50/852 |
| | | | | 257/40 |
| 2023/0354651 | A1 * | 11/2023 | Taguchi | H10K 59/38 |
| 2023/0363240 | A1 * | 11/2023 | Fukuchi | H10K 59/122 |
| 2024/0147762 | A1 | 5/2024 | Koshihara | |

FOREIGN PATENT DOCUMENTS

| | | | |
|---|---|---|---|
| JP | 2012-227247 | A | 11/2012 |
| JP | 2013-073884 | A | 4/2013 |
| JP | 2015-046239 | A | 3/2015 |
| WO | 2019/215530 | A1 | 11/2019 |

* cited by examiner

FIG. 5A
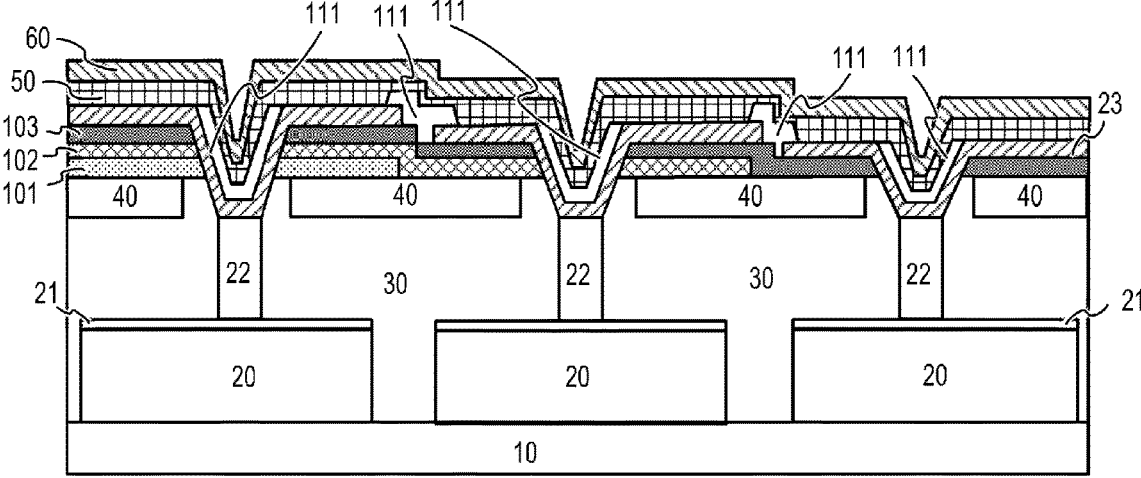
FIG. 5B
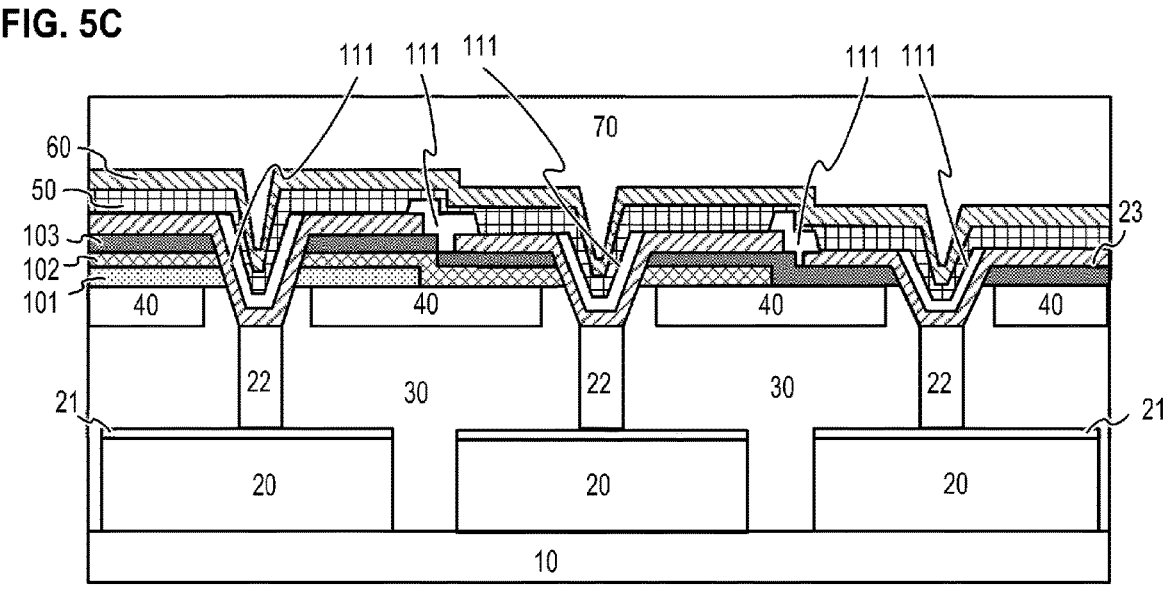
FIG. 5C

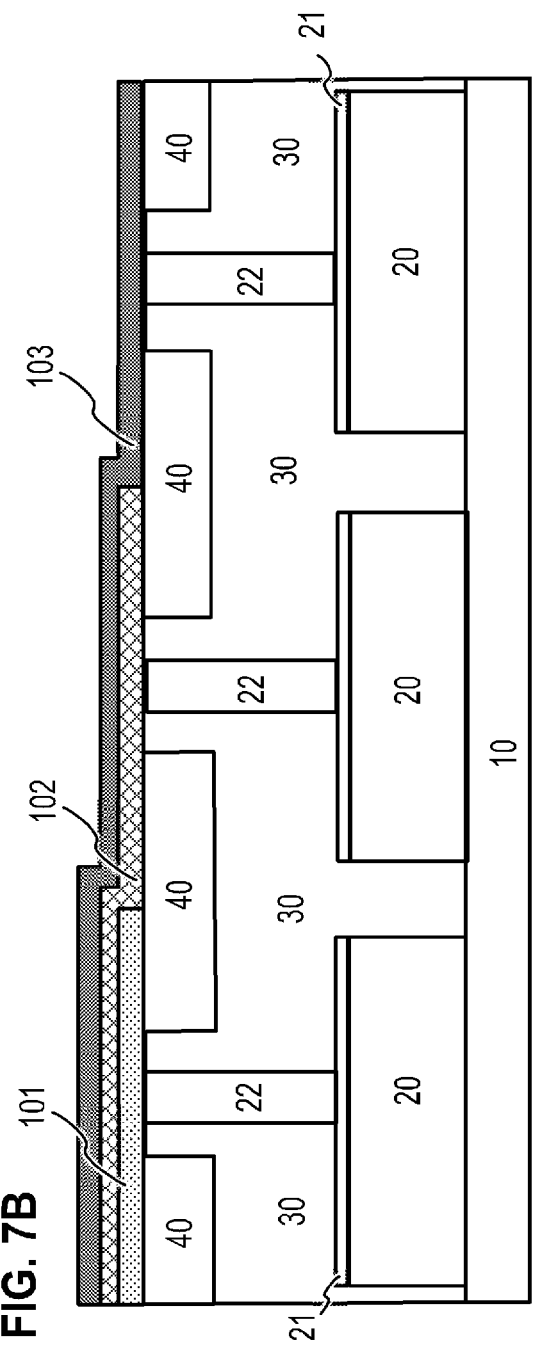

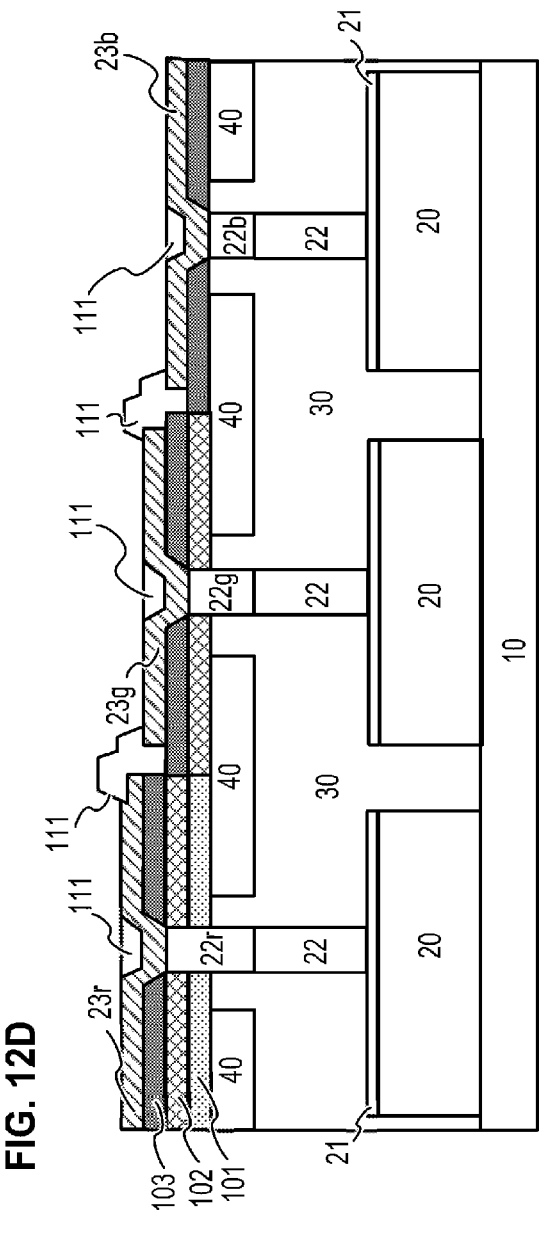

1405
1404
1403
1402
1401
1400

1503
1500
1502
1501

LIGHT-EMITTING ELEMENT, LIGHT-EMITTING DEVICE, PHOTOELECTRIC CONVERSION DEVICE, AND ELECTRONIC DEVICE

BACKGROUND OF THE INVENTION

Field of the Invention

The present invention relates to a light-emitting element, a light-emitting device, a photoelectric conversion device, and an electronic device.

Description of the Related Art

Characteristics of organic light-emitting elements include for instance being self-luminous, having a high response speed, and consuming little power by virtue of not requiring a backlight. Thanks to these characteristics, display devices that utilize organic light-emitting elements are taking on a leading role in color display devices, in place of liquid crystal display devices.

Anode electrodes in organic light-emitting elements need to be electrically connected to lower-layer wiring. In Japanese Patent Application Publication No. 2013-73884 (hereinafter PTL 1), a deep through-hole is provided in a lower layer including a reflective layer, as illustrated in FIG. 14, to thereby form an electrical contact portion between an anode electrode and lower-layer wiring.

In a case where the anode electrode is connected to a lower layer via a through-hole, as in PTL 1, it is however necessary to set down a wall surface of the through-hole towards the substrate (to reduce $\theta$ in FIG. 14). Also, the through-hole must be made deeper in a case where the anode electrode is set to be in direct contact with the lower-layer wiring, as in PTL 1. Therefore, an opening width of the through-hole (S in FIG. 14) had to be increased. This is disadvantageous from the viewpoint of achieving a smaller organic light-emitting element (achieving higher definition). It was thus conventionally not possible to reduce the size of the organic light-emitting element.

SUMMARY OF THE INVENTION

It is an object of the disclosure of the present art to reduce the size of a light-emitting element.

An aspect of the disclosure is a light-emitting element having an emission region and a contact region, wherein in the emission region, the light-emitting element has a wiring layer, an interlayer insulating layer, a reflective layer, an optical adjustment layer, a first electrode, a light-emitting layer, and a second electrode, in this order from a substrate side; in the contact region, the light-emitting element has the wiring layer, a conductor, the first electrode, the light-emitting layer, and a second electrode, in this order from the substrate side; the conductor is electrically connected to both the first electrode and the wiring layer; and a shortest distance between the substrate and the first electrode in the contact region is equal to or greater than a shortest distance between the substrate and the reflective layer in the emission region.

An aspect of the disclosure is a light-emitting element having an emission region and a contact region, wherein in the emission region, the light-emitting element has a wiring layer, an interlayer insulating layer, a reflective layer, an optical adjustment layer, a first electrode, a light-emitting layer, and a second electrode, in this order from a substrate side; in the contact region, the light-emitting element has the wiring layer, a conductor, the first electrode, the light-emitting layer, and the second electrode, in this order from the substrate side; the conductor is electrically connected to both the first electrode and the wiring layer; and an area of the conductor is smaller than an area of the wiring layer, in a plan view of the substrate.

Further features of the present invention will become apparent from the following description of exemplary embodiments (with reference to the attached drawings).

BRIEF DESCRIPTION OF THE DRAWINGS

FIG. 5A to FIG. 5C are diagrams for explaining the formation process of the organic light-emitting element according to Embodiment 1;

FIG. 7A to FIG. 7D are diagrams for explaining the formation process of the organic light-emitting element according to Embodiment 2;

FIG. 12A to FIG. 12D are diagrams for explaining the formation process of the organic light-emitting element according to Embodiment 3;

DESCRIPTION OF THE EMBODIMENTS

Preferred embodiments of the present invention will be explained in detail below with reference to accompanying drawings. The constituent elements described in the embodiments are however merely illustrative in nature; the technical scope of the present invention is thus determined by the claims, and is not limited by the individual embodiments set out below. The present invention is not limited to the embodiments below, and can accommodate various modifications (including organic combinations of respective embodiments) on the basis of the purport of the disclosure of the present specification. That is, all the configurations resulting from combining the embodiments and variations thereof described below are also encompassed in the embodiments disclosed in the present specification.

In the following explanation, the direction of a light-emitting layer (organic compound layer) with respect to a substrate will be referred to as the upward direction, and the opposite direction will be referred to as the downward direction. In the present embodiment, the emission direction of light is the upward direction. A feature wherein a second layer is provided on a first layer includes both an instance where the first layer and the second layer are in contact with each other, and an instance where one or a plurality of third layers is interposed between the first layer and the second layer. The term "depth" denotes length in the upward direction (downward direction). The term "width" denotes length in a direction perpendicular to the upward direction (length in a direction parallel to the surface on which the substrate spreads (main surface of the substrate)).

Embodiment 1

Figure 1A:
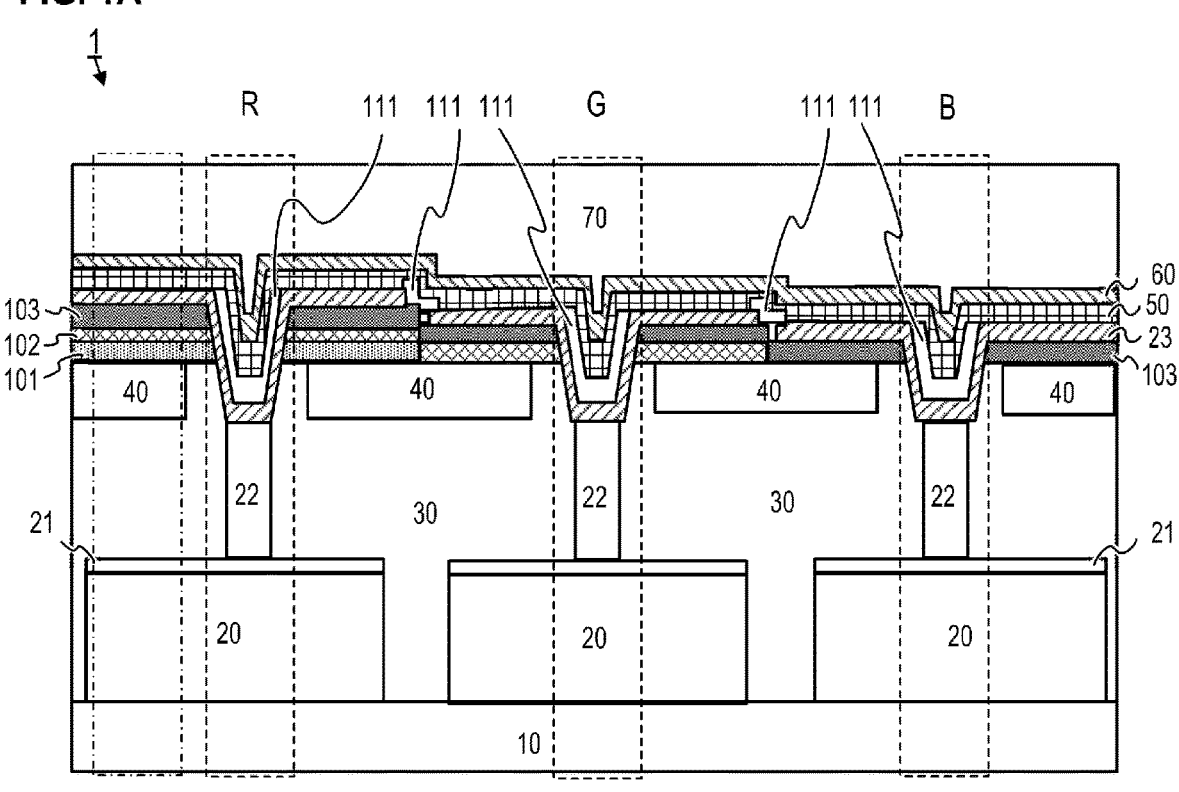
FIG. 1A is a cross-sectional diagram of an organic light-emitting element according to Embodiment 1.

FIG. 1A is a cross-sectional diagram of an organic light-emitting element 1 (organic EL display device) which is a light-emitting element according to Embodiment 1. In FIG. 1A, sub-pixels R, B disposed on a substrate represent red, green and blue sub-pixels, respectively. The three sub-pixels R, B form one pixel of the organic light-emitting element 1. The sub-pixels R, B are separated by a below-described bank insulating film 111. In the present embodiment, the light-emitting device is an organic light-emitting element that includes an organic light-emitting material in a light-emitting layer, but may be an inorganic light-emitting element containing an inorganic light-emitting material in a light-emitting layer. Further, each region of the organic light-emitting element 1 corresponding to a respective sub-pixel on the substrate can be regarded as one light-emitting element, and the present embodiment can be regarded as an embodiment pertaining to a light-emitting device having a plurality of light-emitting elements.

The organic light-emitting element 1 has a substrate 10, Al wiring 20, an anti-reflection film 21 on the Al wiring 20, conductors 22 (W plugs), first electrodes 23 (anode electrode), an interlayer insulating layer 30, a reflective layer 40, an organic compound layer (OLED) 50, a second electrode 60 (cathode electrode) and a protective layer 70. The organic light-emitting element 1 has a first interference film 101, a second interference film 102 and a third interference film 103, each being an optical interference film (optical adjustment layer). The organic light-emitting element 1 has a bank insulating film 111 that separates sub-pixels (pixels).

The substrate 10 is formed of (made up of) a material that can support each first electrode 23, the organic compound layer 50 and the second electrode 60. The material of the substrate 10 is suitably glass, plastic, silicon or the like. A switching element (not shown) such as a transistor, the Al wiring 20, the interlayer insulating layer 30 and the like are formed on the substrate 10.

The first electrode 23 is preferably a thin film of a light-transmissive material, from the viewpoint of luminous efficiency. In the present embodiment ITO (indium tin oxide) is used as the material of the first electrode 23 (the first electrode 23 is formed of indium tin oxide). The material of the first electrode 23 may be a transparent conductive oxide such as IZO (indium zinc oxide), or a metal or alloy such as Al, Ag or Pt. The first electrode 23 has a recessed region (opening) in a contact region described below, the recessed region being in contact with each conductor 22.

The organic compound layer 50 is disposed on the first electrode 23, and can be formed in accordance with a known technique such as a vapor deposition or spin coating. The organic compound layer 50 is a layer including at least one light-emitting layer, and may be formed of a plurality of layers. Examples of the plurality of layers include a hole injection layer, a hole transport layer, an electron blocking layer, a light-emitting layer, a hole blocking layer, an electron transport layer, and an electron injection layer. The organic compound layer 50 emits light from the light-emitting layer as a result of recombination of holes injected from the anode and electrons injected from the cathode, in the light-emitting layer. That is, in the organic compound layer 50, emission occurs in the region directly sandwiched between the first electrode 23 and the second electrode 60 (region sandwiched by the electrodes without the bank insulating film 111 interposed in between). The structure of the light-emitting layer may be that of a single layer or a plurality of layers. Each of the light-emitting layers can have a red light-emitting material, a green light-emitting material or a blue light-emitting material, such that white light can be obtained through mixing of respective emission colors. Light-emitting materials having a complementary color relationship, such as a blue light-emitting material and a yellow light-emitting material, may be used in the light-emitting layers.

The second electrode 60 is disposed on the organic compound layer 50 and has light-transmissivity. The second electrode 60 may be a semi-transmissive material having the property (i.e., semi-transmissive reflectivity) of transmitting part of the light that reaches the surface of the material, and reflecting the remainder. In the present embodiment the material making up the second electrode 60 may be MgAg. However, the material constituting the second electrode 60 may be, for instance, a transparent conductive oxide such as ITO or IZO, or a semi-transmissive material made up of a metallic material. Examples of metallic materials include elemental metals such as aluminum, silver and gold, alkali metals such as lithium and cesium, alkaline-earth metals such as magnesium, calcium and barium, and alloy materials containing the foregoing metallic materials. An alloy containing magnesium or silver as a main component is particularly preferable as the semi-transmissive material. The second electrode 60 may have a multilayer structure of the above materials, so long as the second electrode 60 has a preferred transmittance.

The reflective layer 40 reflects the light emitted in the organic compound layer 50 and having passed through the first electrode 23. The light reflected by the reflective layer 40 is extracted from the second electrode 60 towards the light irradiation side. The reflective layer 40 is preferably formed of a metallic material such as Al or Ag, or an alloy obtained by adding Si, Cu, Ni, Nd, Ti or the like to the foregoing, has more preferably Al as a main component, and is yet more preferably an Al alloy (aluminum alloy). The term main component as used herein denotes the constituent element of highest content in ratio by weight. Voltage may be applied to the reflective layer 40, and accordingly the reflective layer 40 may be a reflective electrode. The reflective layer 40 has an opening in order to form a region for contact (connection) of the first electrode 23 and the conductor 22. This opening can be columnar. Therefore, an opening width of the reflective layer 40 can be the diameter of the bottom face portion of the opening.

The Al wiring 20 is formed of a metal containing Al as a main component, and is lower-layer wiring (wiring layer) connected to an external power source. The Al wiring 20 is connected to the conductor 22, with low contact resistance, and is electrically connected thereby to the first electrode 23. Connection of the first electrode 23 to the Al wiring 20 can also be conceivably achieved through electrical connection of the Al wiring 20 to the reflective layer 40, followed by connection of the reflective layer 40 and the first electrode 23. That is, the first electrode 23 and the Al wiring 20 may be conceivably connected to each other via the reflective layer 40. In this case, however, a barrier metal such as TiN, Mo or Cr is needed at the interface for the purpose of lowering the resistance at the contact between the first electrode 23 and the reflective layer 40. When such a barrier metal is provided on the surface of the reflective layer 40, the reflectance of the reflective layer 40 drops and the emission brightness of the light-emitting element decreases. In such a case it is thus necessary to increase the size of the light-emitting element in order to maintain the emission brightness of the light-emitting element; this makes it hence difficult to reduce the size of the light-emitting element.

In the present embodiment, therefore, each first electrode 23 and the Al wiring 20 are electrically connected via a respective conductor 22. The conductor 22 is connected to the first electrode 23 and the Al wiring 20, and has low contact resistance to the first electrode 23 and to the Al wiring 20. On the other hand, the conductor 22 is not electrically connected to the reflective layer 40. The conductor 22 is formed of a second metal different from the first metal that makes up the reflective layer 40, and may be formed of, for instance, a metal containing W (tungsten). By having W as the material thereof, the conductor 22 can elicit low-resistance contact with both the Al wiring 20 and the first electrode 23. That is, the first electrode 23 and the Al wiring 20 can be electrically connected with low resistance if the material of the conductor 22 is W.

The conductor 22 has a plug shape and is formed by being embedded in a through-hole that is provided in an insulating layer that includes the interlayer insulating layer 30. By forming the conductor 22 into a plug shape it becomes possible to increase the depth of the through-hole, without formation of a through-hole side wall significantly set down towards the substrate 10. The angle that the side wall of the through-hole surrounding the conductor 22 forms with the substrate 10 is larger than the angle formed by the recessed region of the first electrode 23 and the substrate 10. The side wall of the through-hole surrounding the conductor 22 may be substantially perpendicular to the substrate 10. The size (surface area) of the conductor 22 is smaller than the size (surface area) of the Al wiring 20 in a plan view of the organic light-emitting element 1 (substrate 10) (when the organic light-emitting element 1 is viewed from the upward direction (stacking direction)). As a result it becomes possible to prevent the volume of the conductor 22 itself from being large, and accordingly the presence of the conductor 22 is not herein hindrance to reducing the size of the organic light-emitting element 1.

In the present embodiment the material of the anti-reflection film 21 may be TiN. The material of the interlayer insulating layer 30, the first interference film 101, the second interference film 102, the third interference film 103 and the bank insulating film 111 may be SiO.

In the present embodiment, the region of the organic compound layer 50 spreading in the stacking direction, from within the region that projects light, is referred to as an "emission region". Therefore, the region surrounded by the chain line in FIG. 1A may be an emission region. In the emission region, in this order from the substrate side, the substrate 10, the Al wiring 20, the interlayer insulating layer 30, the reflective layer 40, the optical interference film (optical adjustment layer), the first electrode 23, the organic compound layer 50, the second electrode 60 and the protective layer 70 are stacked. It suffices herein that the layers be stacked in this order, in the emission region; other structures may be present between the layers.

In the present embodiment, the region spreading in the stacking direction from the conductor 22 and the recessed region of the first electrode 23 is referred to as a "contact region". Therefore, each region in FIG. 1A surrounded by a dashed line may be a contact region. In each contact region, the substrate 10, the Al wiring 20, the first electrode 23, the bank insulating film 111, the organic compound layer 50, the second electrode 60 and the protective layer 70 are stacked in this order, from the substrate side. It suffices herein that the layers be stacked in this order, in the contact region; other structures may be present between the layers. Further, the contact region includes the conductor 22 between the Al wiring 20 and the first electrode 23, but the contact region does not include the reflective layer 40. Therefore, it is considered that the contact region and the emission region can be determined by the presence or absence of the reflective layer 40. The recessed region of the first electrode 23 in the contact region is surrounded by the reflective layer 40. In the contact region, the first electrode 23 is electrically connected to the Al wiring 20 via an opening (a region surrounded by the reflective layer 40) provided in the reflective layer 40. The contact region is included in the opening of the reflective layer 40, in a plan view of the substrate 10.

In the contact region, the bank insulating film 111 is disposed between the first electrode 23 and the organic compound layer 50. By virtue of the fact that the bank insulating film 111 is disposed in this manner, the light-emitting layer of the organic compound layer 50 can be prevented from emitting light, in the contact region.

Further, the top face of the surface of the conductor 22 in the contact region (the surface in contact with the first electrode 23) is closer to the substrate 10 than the first electrode 23 to the substrate 10 in the emission region (a distance between the top face of the conductor 22 in the contact region and the substrate 10 is shorter than a distance between the first electrode 23 in the emission region and the substrate 10). That is, in the present embodiment the position of the conductor 22 lying farthest from the substrate 10 is still not farther from the substrate 10 than the closest position of the first electrode 23 to the substrate 10. In such a configuration, the recessed region of the first electrode 23 can be made shallow, and hence it is possible to narrow the recessed region of the first electrode 23 and the opening of the reflective layer 40. This is accordingly advantageous in terms of reducing the size of the organic light-emitting element 1.

In the present embodiment, the position of the top face of the conductor 22 (surface in contact with the first electrode 23) and the position of the lower face of the reflective layer 40 (surface in contact with the interlayer insulating layer 30) are the same in the height direction. Contact formation of the first electrode 23 becomes easier as a result. In the present embodiment the term "height" denotes the shortest distance from the substrate 10. That is, in the present embodiment the shortest distance between the top face of the conductor 22 and the substrate 10 is identical to the shortest distance between the lower face of the reflective layer 40 and the substrate 10. This can be rephrased as entailing that the first electrode 23 in the contact region and the reflective layer 40 in the emission region are at a same distance from (closeness to) the substrate 10.

FIG. 1A illustrates an example in which the optical interference film of the organic light-emitting element 1 has a three-layer structure that includes the first interference film 101, the second interference film 102 and the third interference film 103, but the number of layers is not particularly limited, and a single-layer structure may be adopted.

(Formation Process of the Organic Light-Emitting Element): FIG. 2A to FIG. 5C illustrate schematically cross-sectional diagrams of the steps for forming the organic light-emitting element 1 of FIG. 1A. A method for producing the organic light-emitting element 1 will be explained hereafter in the order of the respective steps.

Figure 2A:
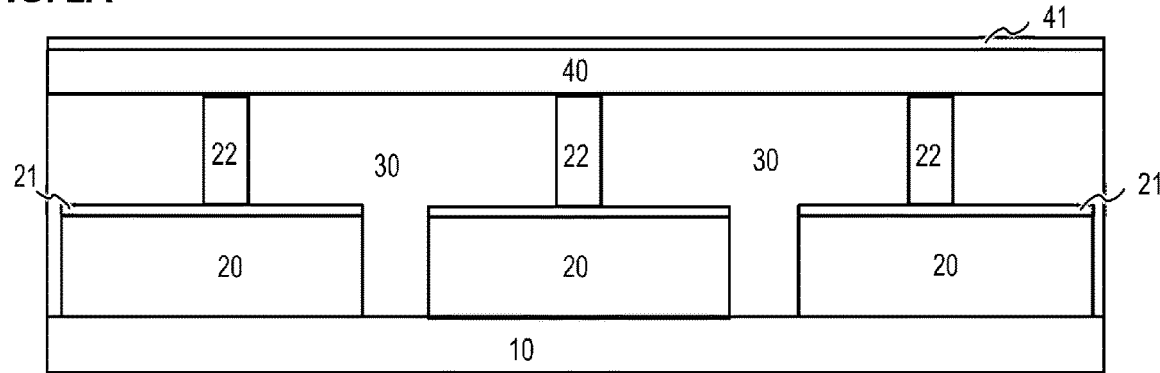
FIG. 2A to FIG. 2C are diagrams for explaining a formation process of the organic light-emitting element according to Embodiment 1.

(1) As illustrated in FIG. 2A, a member is formed (prepared) in which the Al wiring 20 is formed on the substrate 10 and the interlayer insulating layer 30. The reflective layer 40 is formed over the interlayer insulating layer 30 and the conductors 22 using Al. The member is formed so that, in this state, the interlayer insulating layer 30 and the conductors 22, and the reflective layer 40, are in contact. Accordingly, the top face of the conductors 22 and the lower face of the reflective layer 40 stand at the same height once formation of the organic light-emitting element 1 is complete. An anti-reflection film 41 is formed on the Al surface of the reflective layer 40, in order to prevent halation at the time of patterning of the reflective layer 40.

Figure 2B:
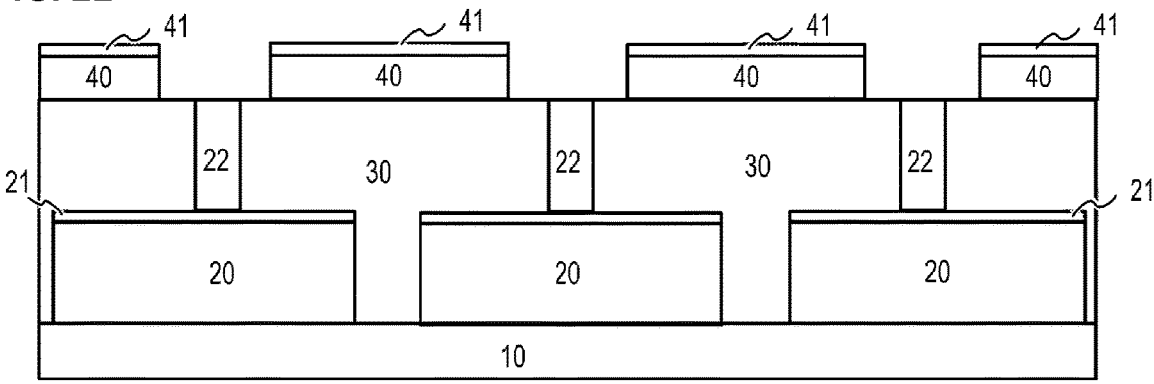

(2) The reflective layer 40 is patterned and etched. The conductors 22 becomes exposed thereupon, as illustrated in FIG. 2B.

Figure 2C:
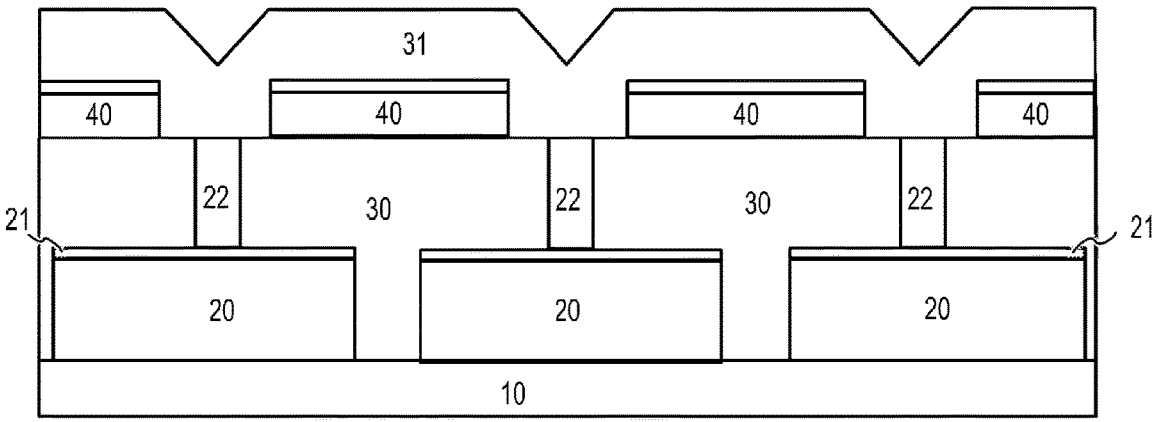

(3) An interlayer insulating layer 31 is formed on the reflective layer 40, as illustrated in FIG. 2C. The steps of patterning, etching and film formation so far are identical to the steps of forming a normal stacked via. Further, the interlayer insulating layer 31 is formed of the same material as that of the interlayer insulating layer 30.

Figure 3A:
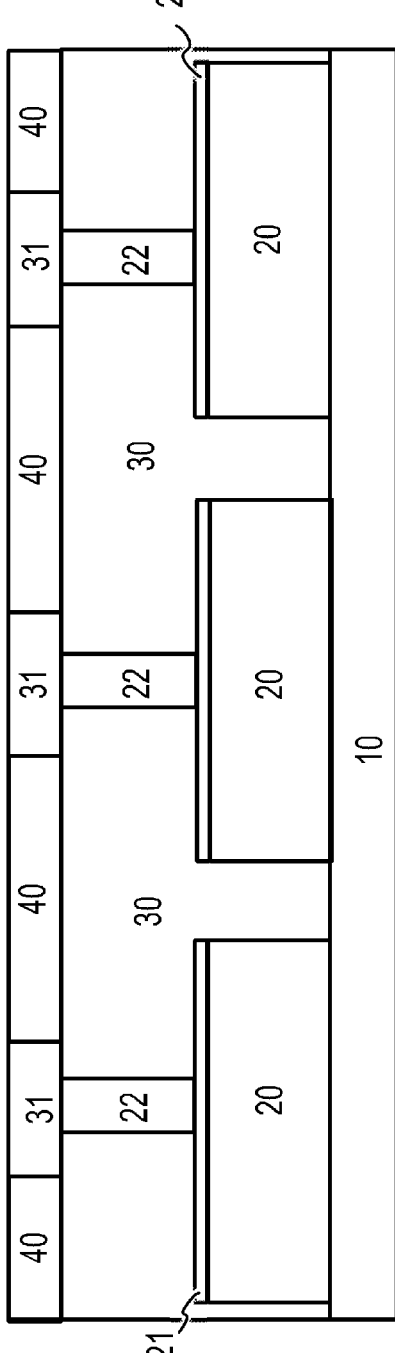
FIG. 3A to FIG. 3D are diagrams for explaining the formation process of the organic light-emitting element according to Embodiment 1.

(4) The interlayer insulating layer 31 is planarized, as illustrated in FIG. 3A, by CMP (Chemical Mechanical Polishing), and is then continuously polished down to the reflective layer 40. At this time, the reflective layer 40 is planarized, and also the anti-reflection film 41 is removed simultaneously therewith. The overall reflectance of reflective layer 40 and the periphery thereof is improved as a result.

Figure 3B:
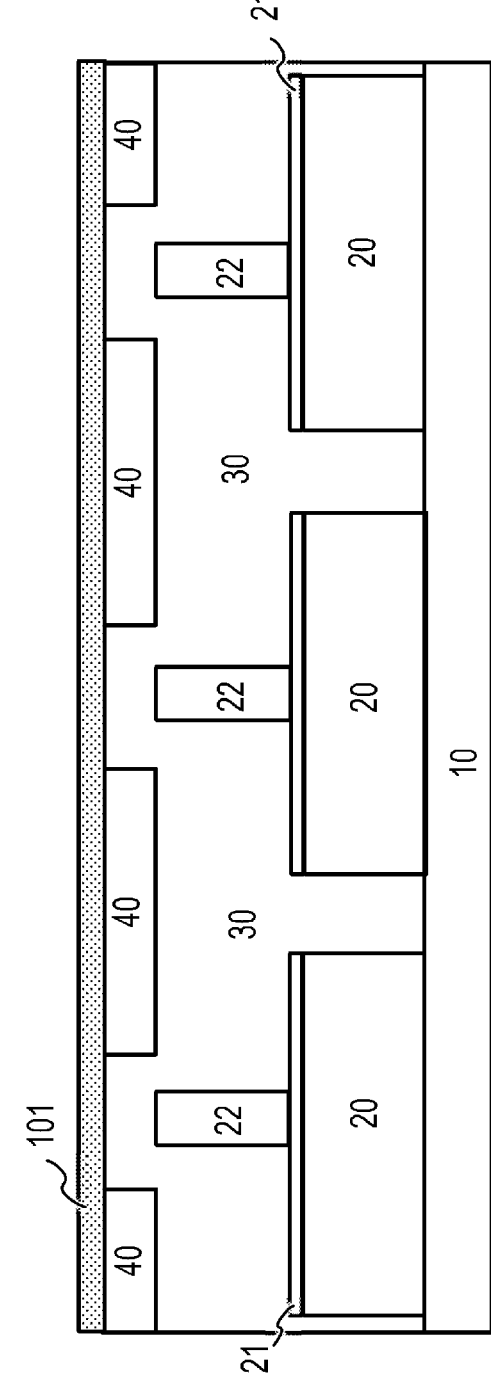
Figures 3C, 3D:
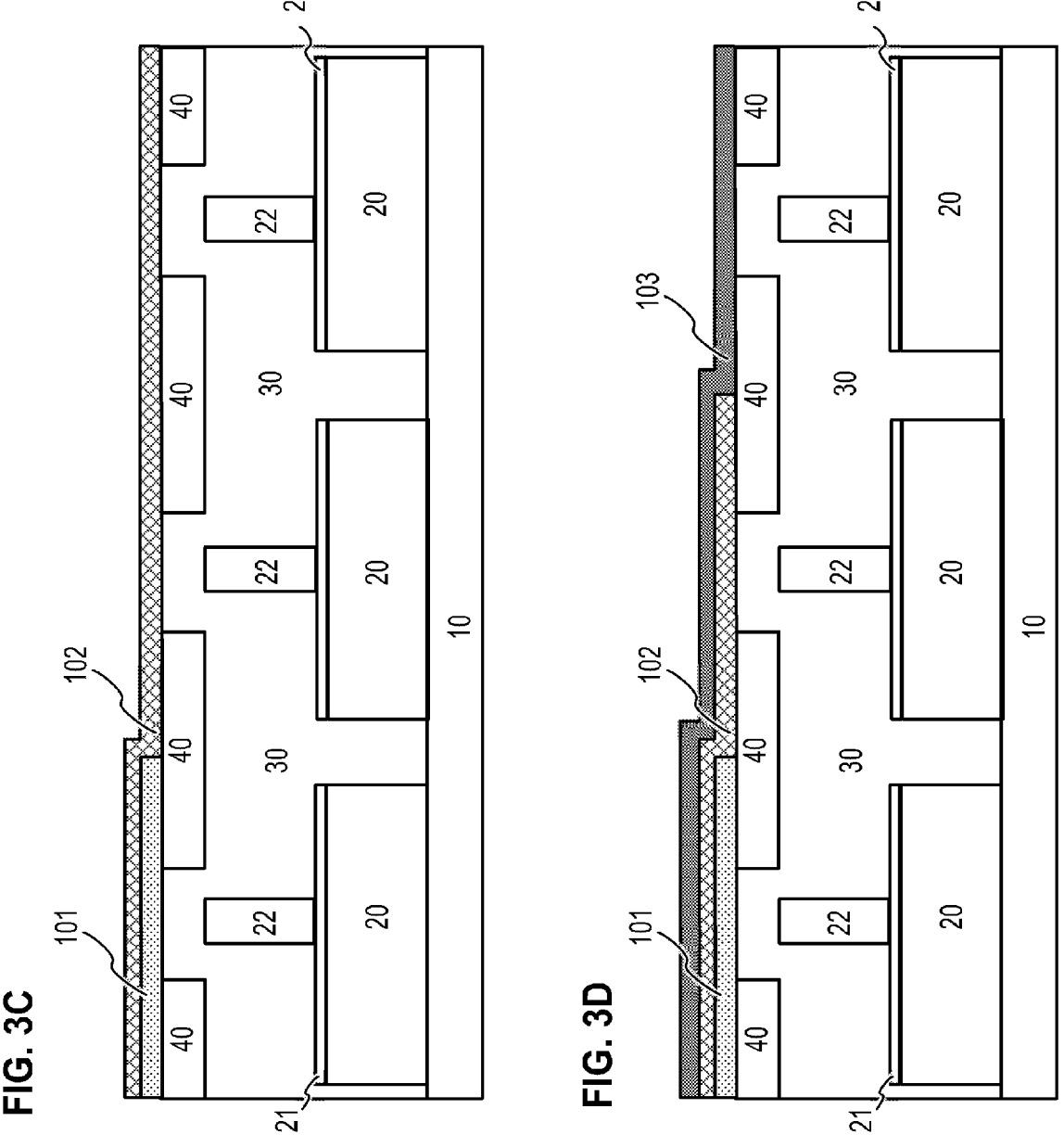

(5) The first interference film 101, the second interference film 102 and the third interference film 103 are formed and etched in the order illustrated in FIG. 3B, FIG. 3C and FIG. 3D. Respective interference films optimized for each of the R, B colors become formed as a result. The interlayer insulating layer 31 and the interlayer insulating layer 30 are formed of the same material; accordingly, the interlayer insulating layer 31 will be illustrated and explained by regarding the interlayer insulating layer 31 as part of the interlayer insulating layer 30.

Figure 4A:
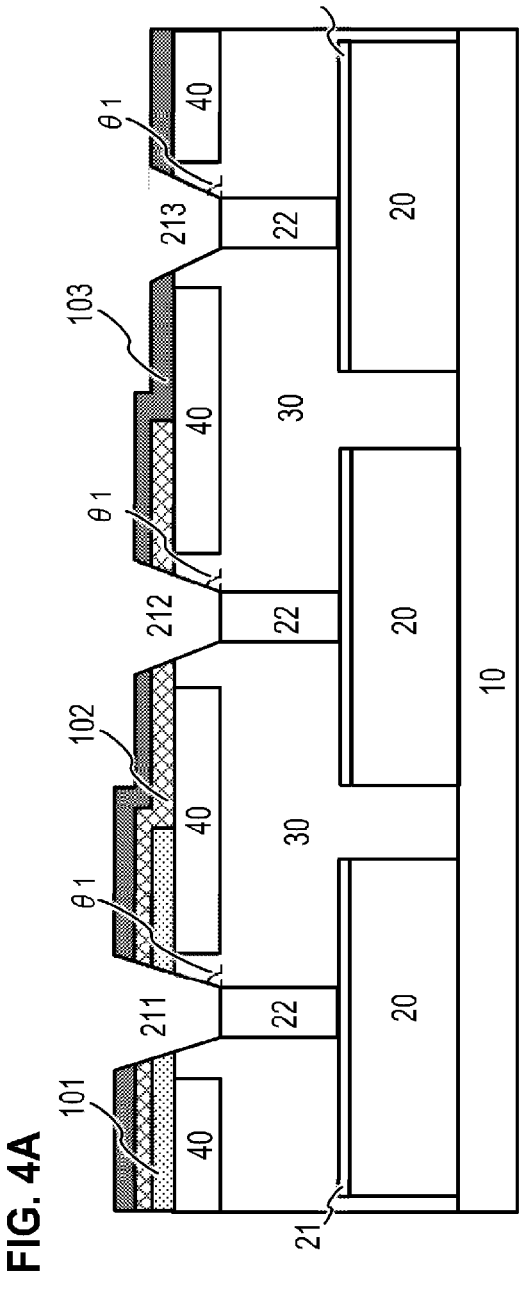
FIG. 4A to FIG. 4D are diagrams for explaining the formation process of the organic light-emitting element according to Embodiment 1.

(6) As illustrated in FIG. 4A, openings 211, 212, 213 are formed, by etching, at the top of each conductor 22 (stacked via). Even if the depths of the openings 211, 212, 213 differ from each other at the time of etching, this is not problematic thanks to the high dry etching selectivity. The openings 211, 212, 213 are formed to the shape of an inverted conical frustum. Herein the taper angles of the openings 211, 212, 213 are set to θ1. The size of the taper angle θ1 is important in terms of forming the first electrodes 23 on the side wall of the openings 211, 212, 213 to a sufficient thickness. Specifically, the smaller the taper angle θ1, the larger can be made the thickness of the respective first electrodes 23 that are formed on the side wall of the openings 211, 212, 213.

Further, the taper angle θ1 of the openings 211, 212, 213 affects current leakage between the anode and cathode upon formation of the organic compound layer 50 and the second electrode 60, and accordingly the taper angle θ1 should be as small as possible. Specifically, the taper angle θ1 is preferably equal to or smaller than a taper angle θ2 (see FIG. 4D) of the bank insulating film 111 that suppresses leakage between sub-pixels (between pixels). The taper angle denotes an angle with respect to the surface on which the substrate 10 spreads (surface perpendicular to the stacking direction on the substrate 10; i.e. a main surface). In FIG. 1A, the taper angle θ1 can be said to be the angle of the surface of the interlayer insulating layer 30 in contact with the first electrodes 23, in the contact region, with respect to the surface on which the substrate 10 spreads. Alternatively, the taper angle θ1 can be said to be the angle of the outer wall (surface in contact with the interlayer insulating layer 30) of the recessed region of each first electrode 23, in the contact region, with respect to the surface on which the substrate 10 spreads. In FIG. 1A, the taper angle θ2 can be said to be the angle of the side face of the bank insulating film 111 that is present at the end of each sub-pixel (emission region), relative to the surface on which the substrate 10 spreads.

Figure 4B:
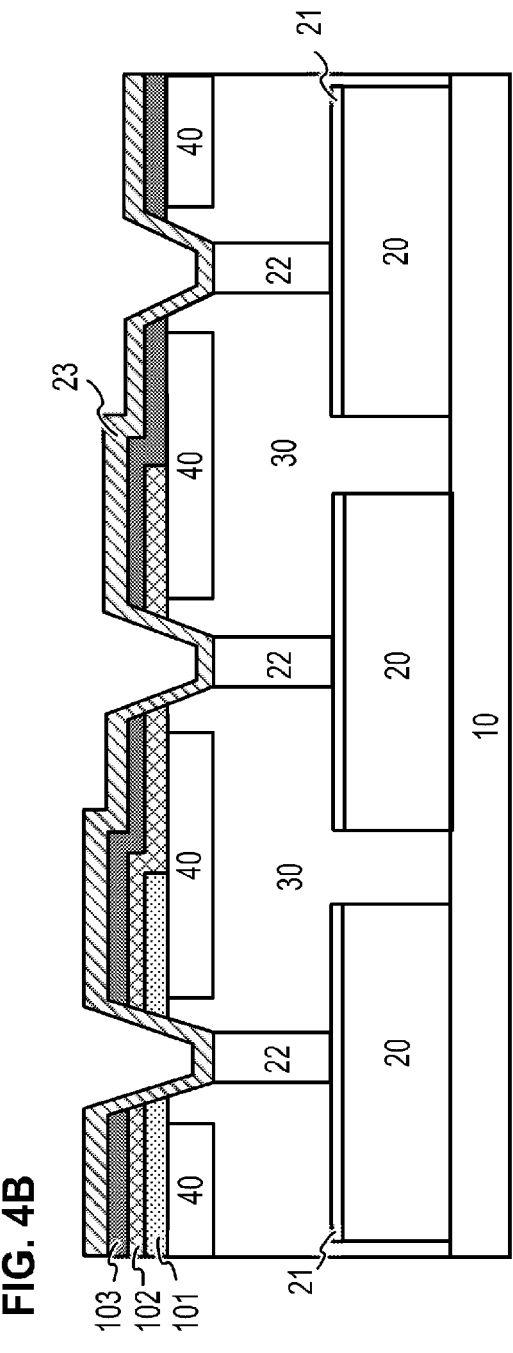

(7) As illustrated in FIG. 4B, each first electrode 23 is formed at the top of the third interference film 103 and on the side walls of the openings 211, 212, 213. It is known that ITO, which is the material of the first electrode 23, reacts at the interface when coming into direct contact with Al, whereupon contact resistance increases. In the present embodiment, by contrast, the first electrode 23 is in physical contact with the respective conductor 22 formed of W (tungsten), instead of with the reflective layer 40 formed of Al. In consequence, contact between the first electrode 23 and the conductor 22 can be accomplished with low resistance.

Figure 4C:
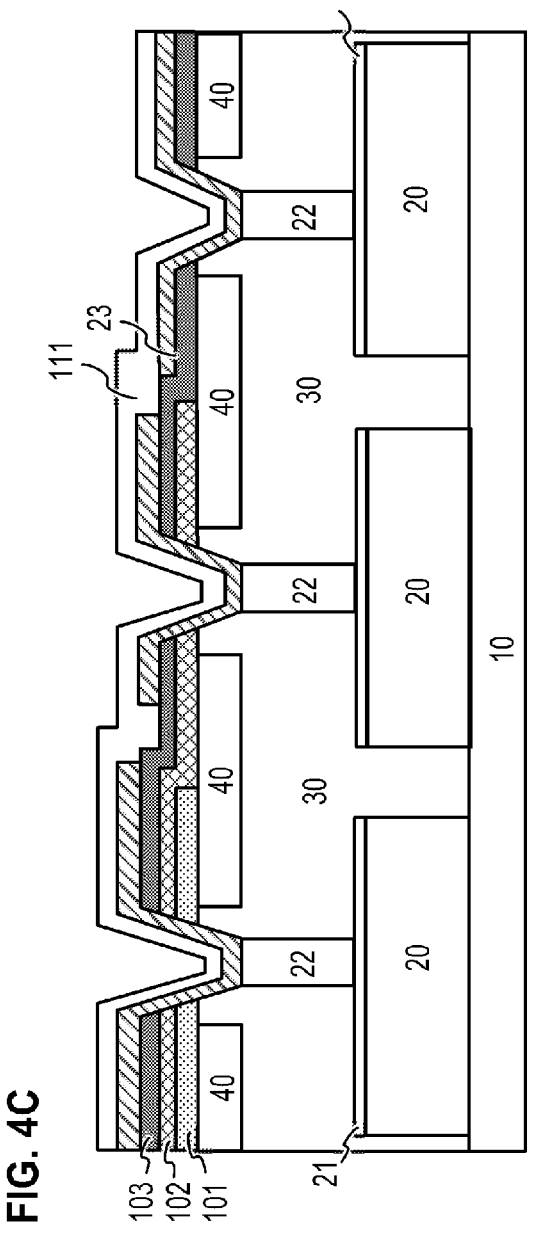
Figure 4D:
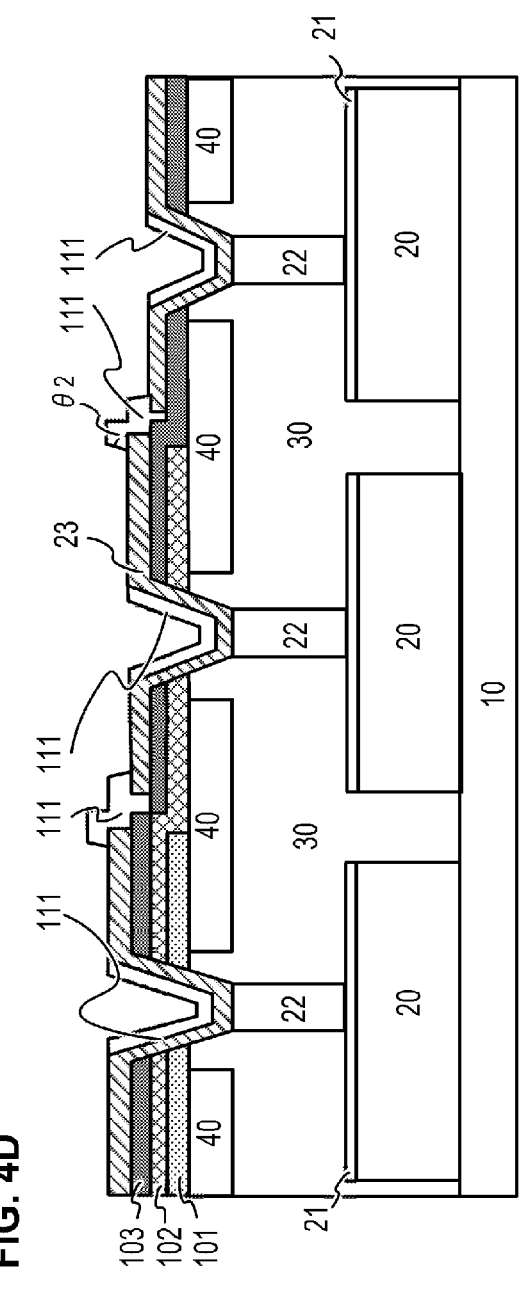

(8) After formation of the bank insulating film 111 for pixel separation, as illustrated in FIG. 4C, the bank insulating film 111 is patterned and etched, as illustrated in FIG. 4D.

(9) The organic compound layer 50 is formed, as illustrated in FIG. 5A, and the second electrode 60 is vapor-deposited as illustrated in FIG. 5B. The protective layer 70 is then formed, as illustrated in FIG. 5C. An organic light-emitting element 1 such as that illustrated in FIG. 1A can be formed as a result.

As described above, in the present embodiment, the depth of the deepest position (opening; recessed region) of the first electrodes 23 can be reduced by virtue of the fact that the conductors 22 are formed at the top of the Al wiring 20. This allows reducing the width of the recessed region of the first electrodes 23 and the opening width of the reflective layer 40 in the contact region. Therefore, the size of the organic light-emitting element can be reduced even in a configuration where the reflective layer 40 is not electrically connected to the lower-layer wiring (Al wiring 20).

Embodiment 2

Figure 1B:
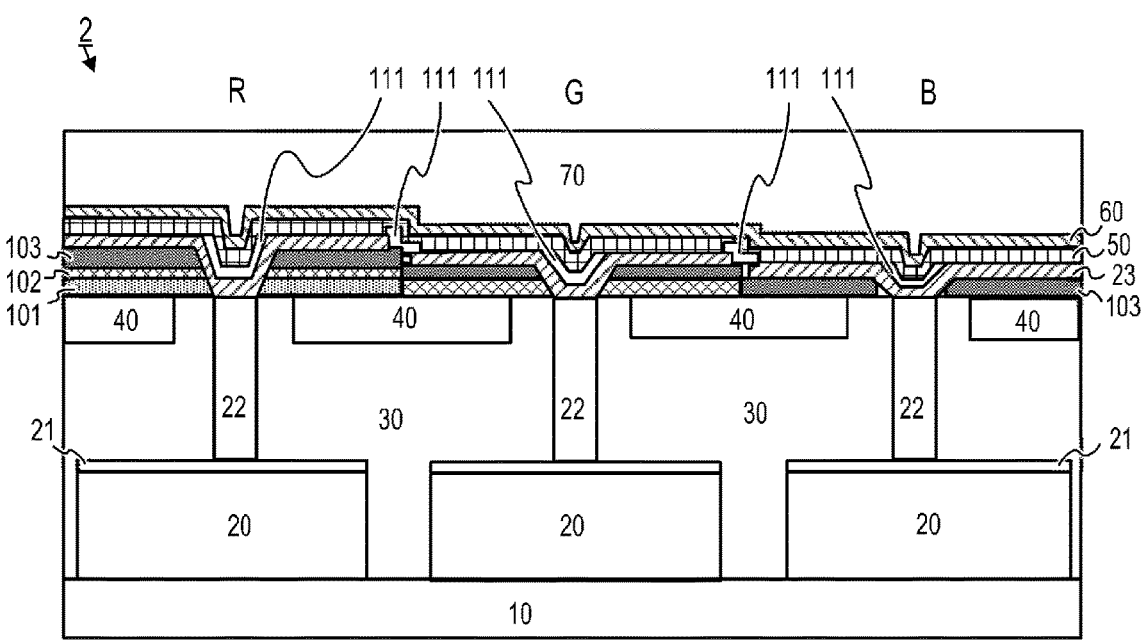
FIG. 1B is a cross-sectional diagram of an organic light-emitting element according to Embodiment 2.

FIG. 1B is a cross-sectional diagram of an organic light-emitting element 2 according to Embodiment 2. The configuration of the organic light-emitting element 2 is substantially identical to the configuration of the organic light-emitting element 1 illustrated in FIG. 1A. The organic light-emitting element 2 differs from the organic light-emitting element 1 according to Embodiment 1 in that now the height of the top face of each conductor 22 lies at the same position as that of the top face of the reflective layer 40. Therefore, the lower face of the reflective layer 40 is closer to the substrate 10 than the top face of the conductors 22 and the first electrodes 23 to the substrate 10. Further, the conductors 22 in the contact region are surrounded by the reflective layer 40.

FIG. 6A to FIG. 7D illustrate schematically cross-sectional diagrams of the steps for forming the organic light-emitting element 2 according to Embodiment 2. A method for forming the organic light-emitting element 2 will be explained hereafter in the order of the respective steps.

Figure 6A:
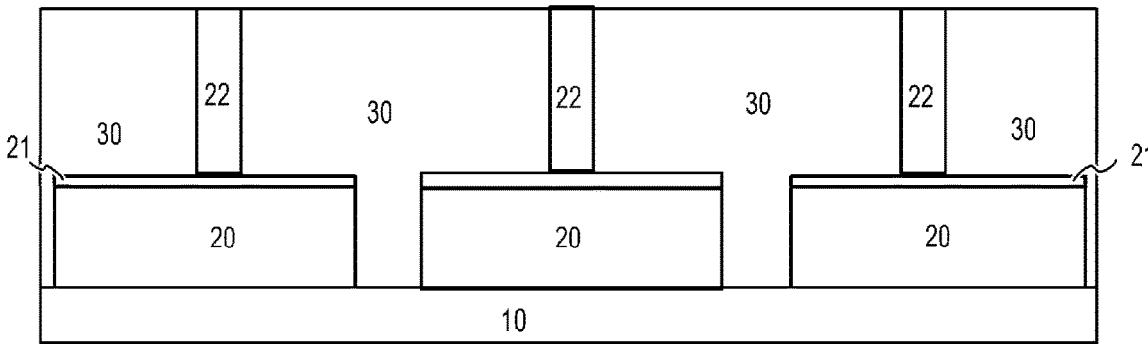
FIG. 6A to FIG. 6C are diagrams for explaining the formation process of the organic light-emitting element according to Embodiment 2.

(1) As illustrated in FIG. 6A, a member having the conductors 22 formed on the Al wiring 20 is prepared (is formed). In this state, the top face of the conductors 22 and the surface (top face) of the interlayer insulating layer 30 stand at the same height.

Figure 6B:
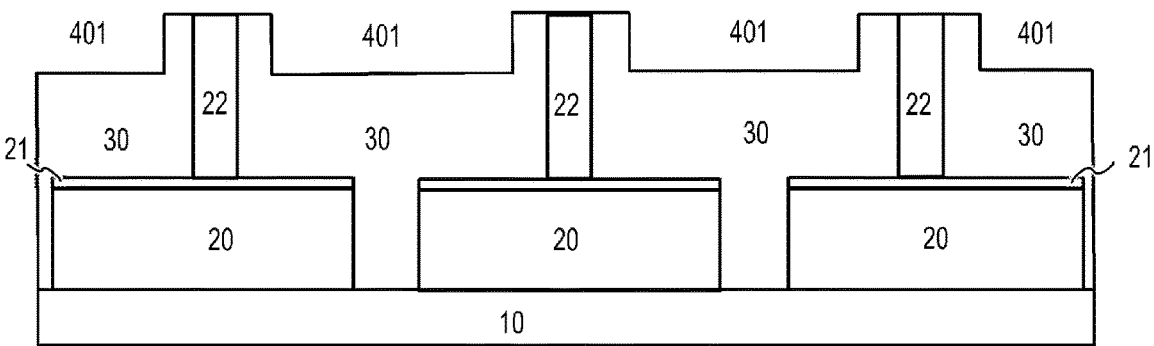

(2) As illustrated in FIG. 6B, a region 401 in which the reflective layer 40 will be formed is dug out through etching of the interlayer insulating layer 30.

Figure 6C:
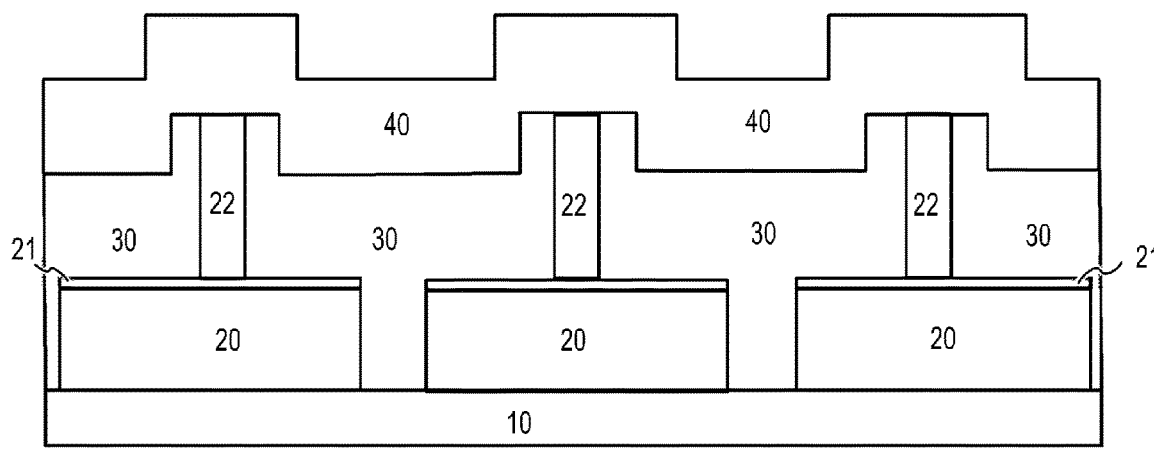

(3) As illustrated in FIG. 6C, the reflective layer 40 is formed through formation of a film of aluminum or an alloy thereof. At this time the thickness of the reflective layer 40 may be set to be 2 to 3 times the depth (level difference) of the region 401, as a guide.

(4) As illustrated in FIG. 7A, the reflective layer 40 is polished in accordance with a damascene method, to expose the conductors 22. In a state such as that illustrated in FIG. 7A, the top face of the conductors 22 and the top face of the reflective layer 40 stand at a same height.

(5) Thereafter, interference films of dissimilar thickness are formed for each of the sub-pixels R, G, B, as illustrated in FIG. 7B, as a result of the same steps as in Embodiment 1 (see FIG. 3B to FIG. 3D).

Figures 7C, 7D:
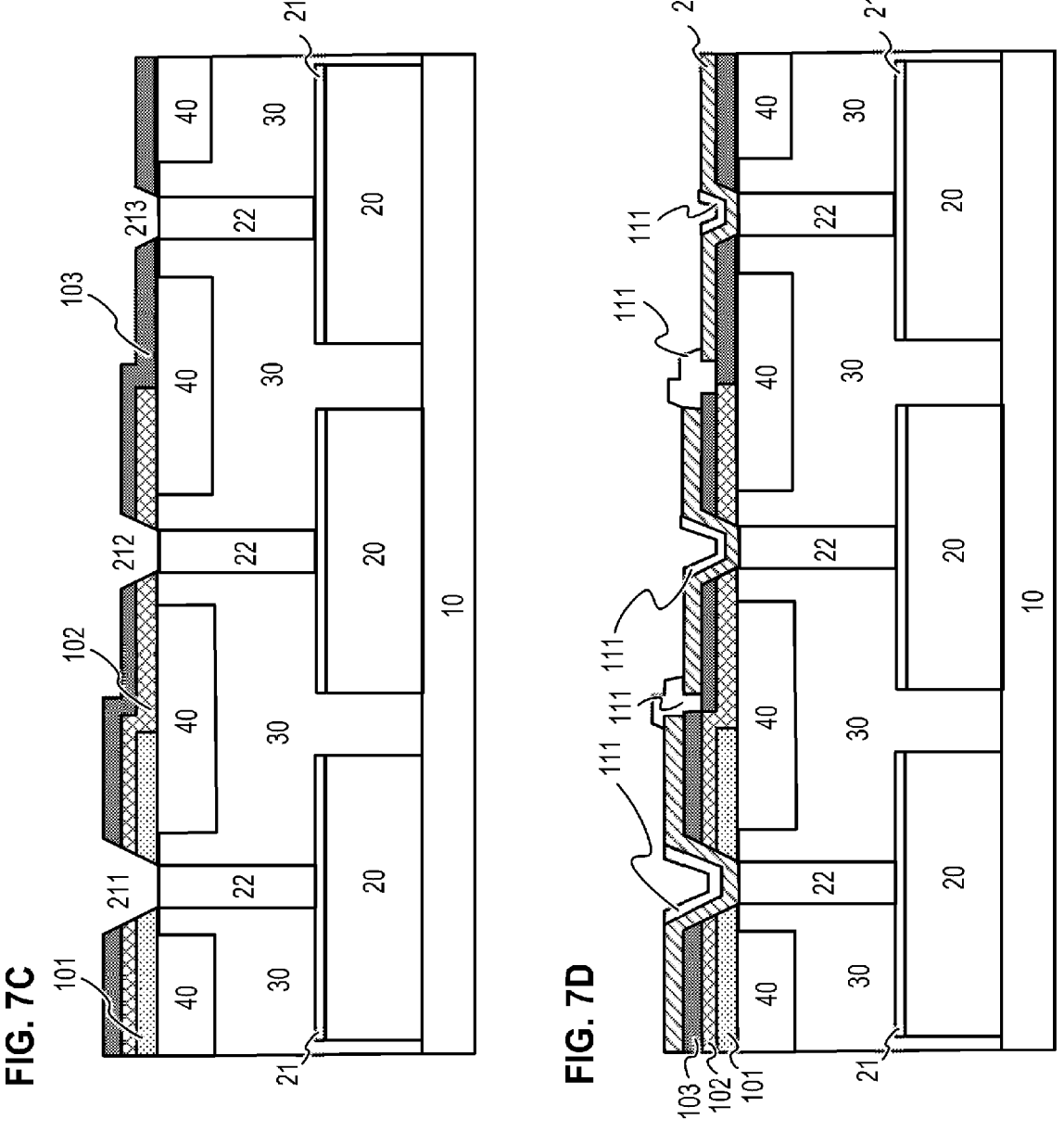

(6) The openings 211, 212, 213 are formed at the top of the conductors 22 (stacked vias), as illustrated in FIG. 7C. At this time, the depth of the openings 211, 212, 213 is smaller, by the thickness of the reflective layer 40, than the depth of the openings 211, 212, 213 according to Embodiment 1. As a result, the width of the openings 211, 212, 213 can be made smaller (narrower) than that in Embodiment 1, even if the taper angle θ1 is set to be identical to that of Embodiment 1.

(7) Thereafter, the first electrodes 23 and the bank insulating film 111 are formed, and are subsequently patterned and etched, as illustrated in FIG. 7D, as a result of the same steps as in Embodiment 1 (see FIG. 4B to FIG. 4D). Thereafter, the organic light-emitting element 2 according to Embodiment 2 becomes formed upon formation of the organic compound layer 50, the second electrode 60 and the protective layer 70, similarly to Embodiment 1.

As described above, also in Embodiment 2 the conductors 22 are formed at the top of the Al wiring 20, and hence the depth of the deepest position of the first electrodes 23 can be reduced. In Embodiment 2 the first electrodes 23 in the contact region are formed at a position farther from the substrate 10 than the reflective layer 40 from the substrate 10. The recessed region of the first electrodes 23 and the opening of the reflective layer 40 in the contact region can be made yet smaller as a result. Therefore, the size of the organic light-emitting element can be reduced even in a configuration where the reflective layer 40 is not electrically connected to the lower-layer wiring (Al wiring 20).

Variation 1

In Embodiment 2, the reflective layer 40 of the organic light-emitting element 2 is formed in accordance with a damascene method (see FIG. 6B to FIG. 7A), but the reflective layer 40 can be realized in accordance with a method other than a damascene method. In the damascene method, the reflective layer 40 is formed and polished after formation of the conductors 22; as described below, however, the conductors 22 may be formed after formation of the reflective layer 40. That is, the following steps explained with reference to FIG. 8A to FIG. 9B may be carried out instead of the steps explained with reference to FIG. 6B to FIG. 7A.

Figure 8A:
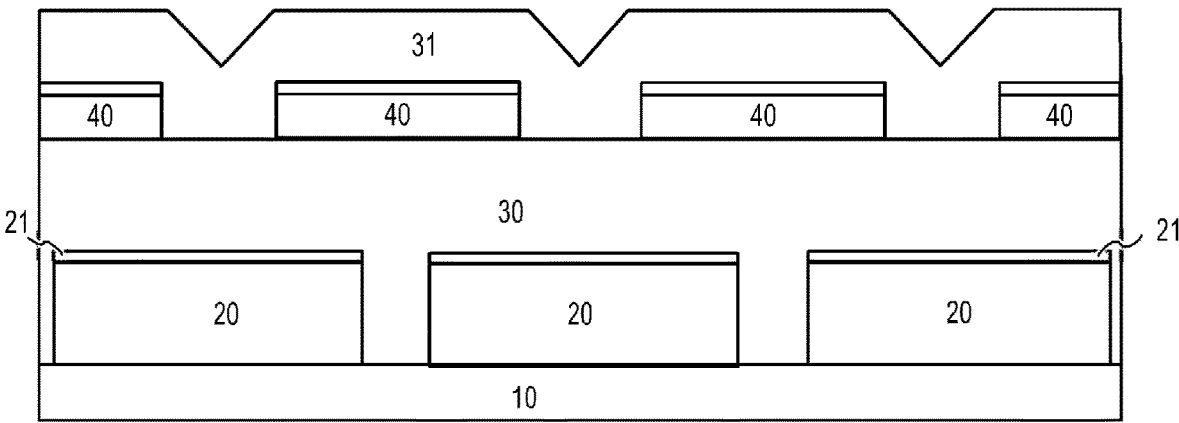
FIG. 8A to FIG. 8C are diagrams for explaining the formation process of an organic light-emitting element according to Variation 1.

(1) From the state illustrated in FIG. 6A, the reflective layer 40 is formed on the top face of the interlayer insulating layer 30, and the reflective layer 40 is then etched, followed by formation of the interlayer insulating layer 31, as illustrated in FIG. 8A.

Figure 8B:
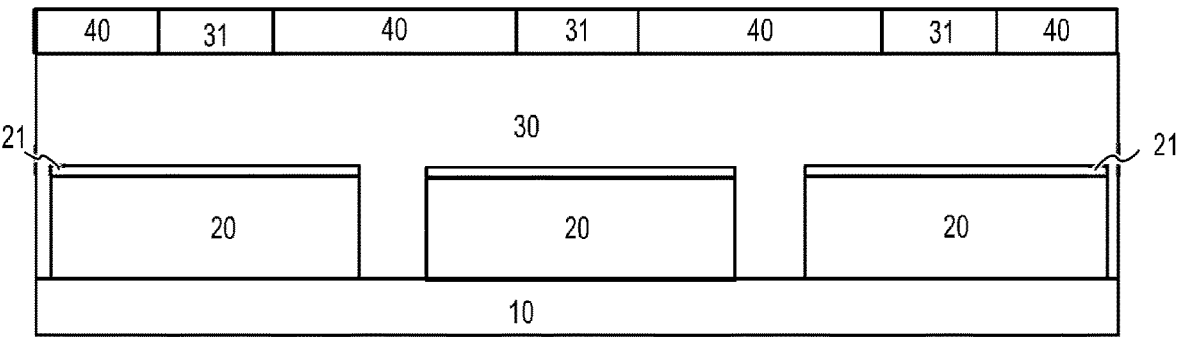

(2) The interlayer insulating layer 31 and the reflective layer 40 are polished, as illustrated in FIG. 8B, by CMP.

Figure 8C:
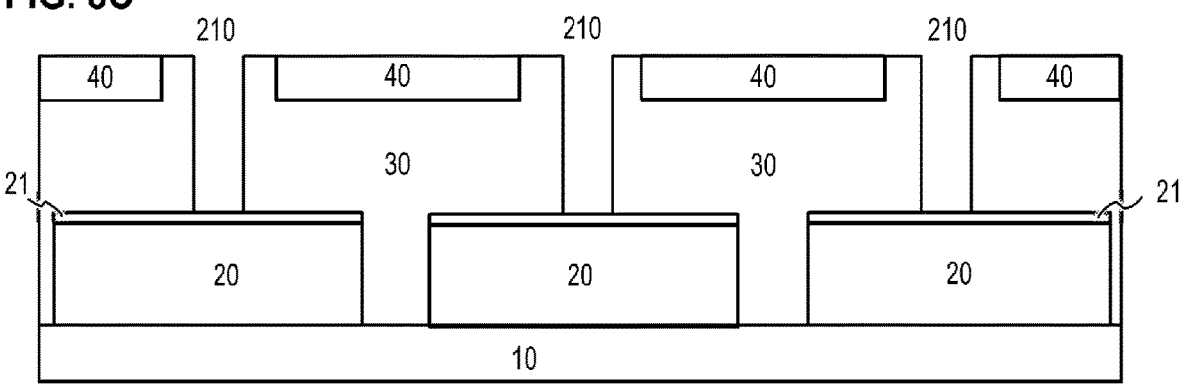
Figure 9A:
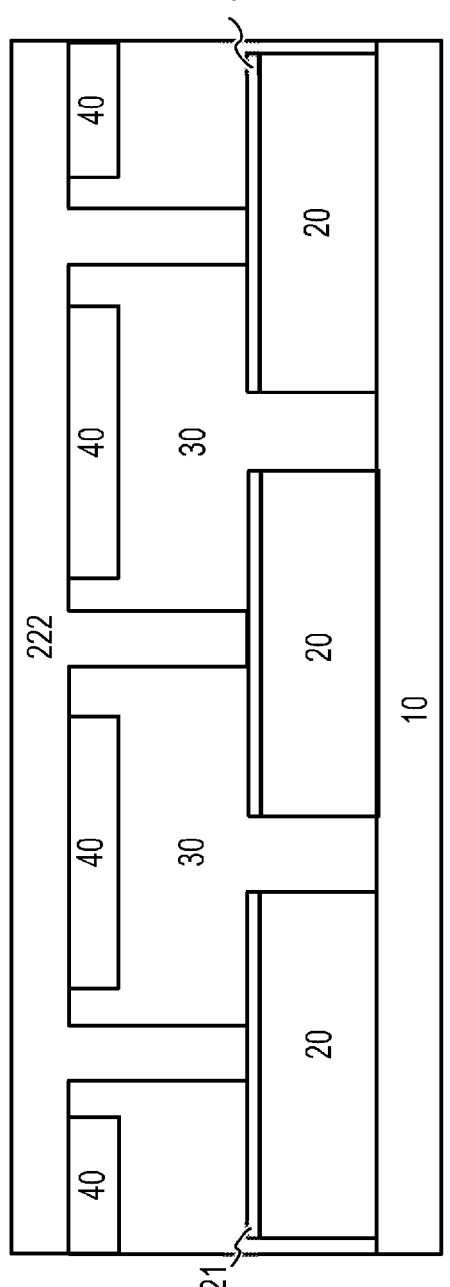
FIG. 9A and FIG. 9B are diagrams for explaining the formation process of an organic light-emitting element according to Variation 1.
Figure 9B:
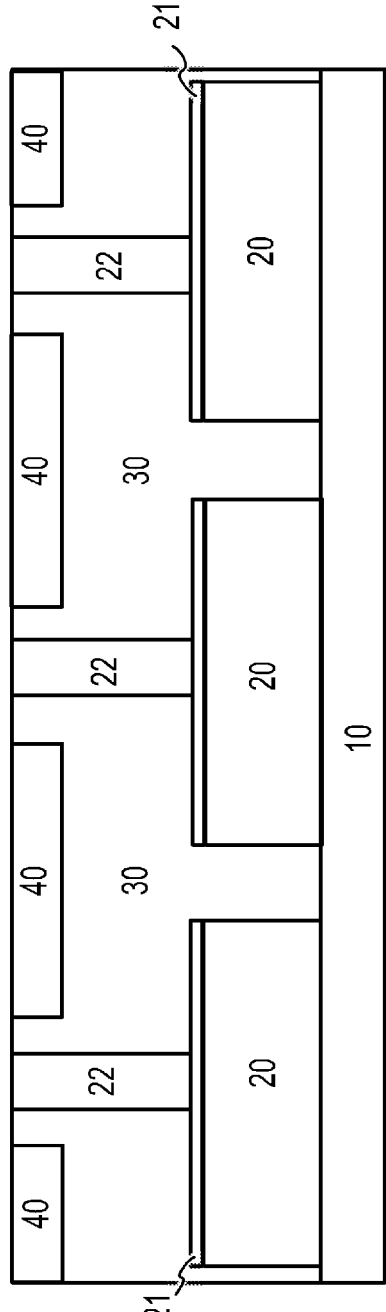

(3) As illustrated in FIG. 8C, openings 210 (through-holes) are formed; then tungsten 222 is formed so as to be in contact with the reflective layer 40, as illustrated in FIG. 9A. As illustrated in FIG. 9B, the tungsten 222 is then polished, by CMP, to form the conductors 22. A member similar to the member illustrated in FIG. 7A can be formed as a result.

Embodiment 3

Figure 10:
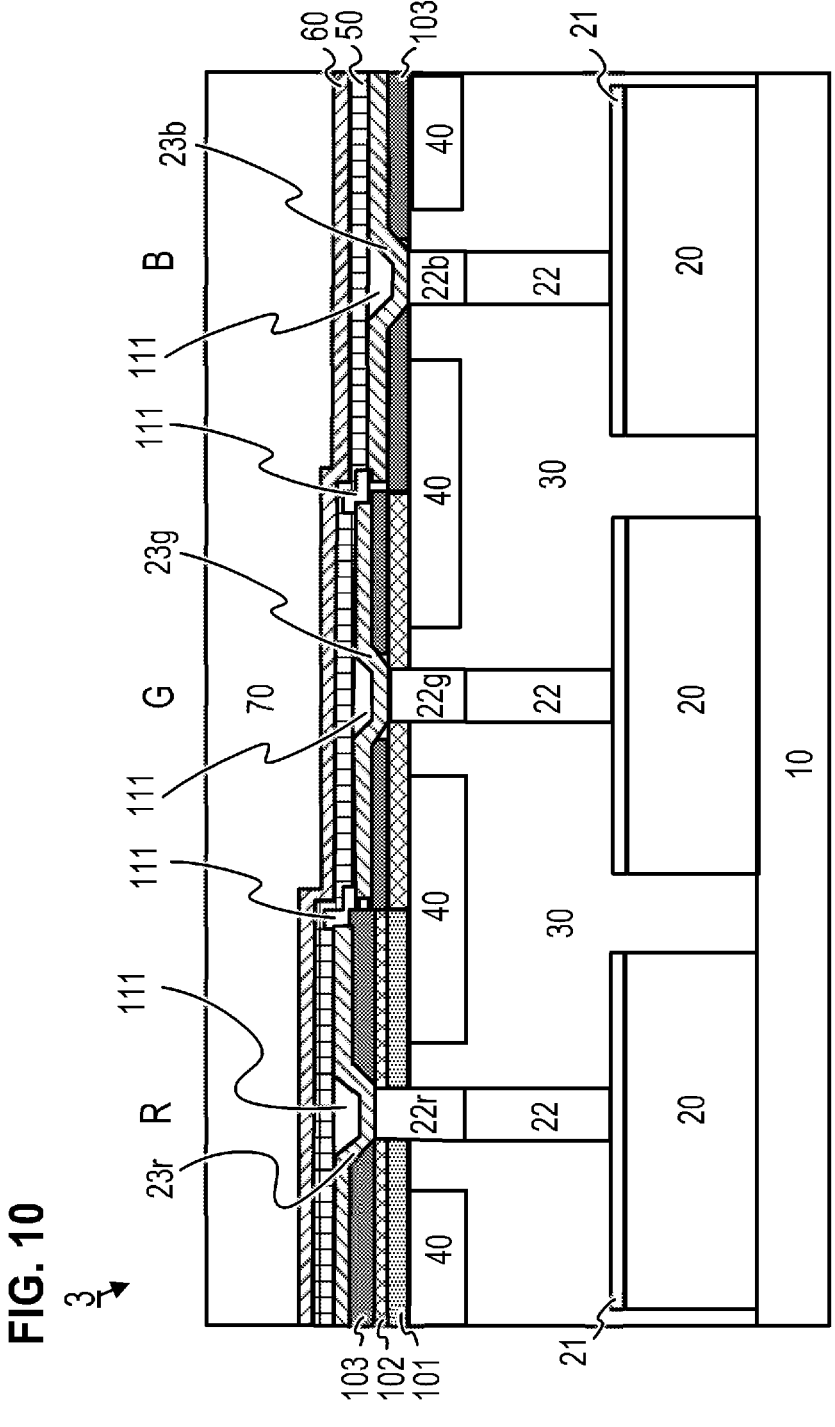
FIG. 10 is a cross-sectional diagram of an organic light-emitting element according to Embodiment 3.

FIG. 10 is a cross-sectional diagram of an organic light-emitting element 3 of Embodiment 3. In the present embodiment, conductors have a two-tiered stack structure in which a respective first-tier conductor 22 and a second-tier conductor 22r are stacked on each other in the sub-pixel R. A respective first-tier conductor 22 and a second-tier conductor 22g are stacked on each other in the sub-pixel and a respective first-tier conductor 22 and a second-tier conductor 22b are stacked on each other in the sub-pixel B. The conductors of the two-tier stack structure have respective different lengths in the direction perpendicular to the main surface of the substrate 10, for each of the sub-pixels R, G, B. For instance, the length of the conductor of the sub-pixel R in the direction perpendicular to the main surface of the substrate 10 is greater than the length of the conductor of the sub-pixel G in the direction perpendicular to the main surface of the substrate 10. Each region corresponding to a reaction sub-pixel in the organic light-emitting element 3 can be regarded herein as one light-emitting element, and thus Embodiment 3 can be regarded as an embodiment pertaining to a light-emitting device having a plurality of light-emitting elements. In a case where, as described above, the present embodiment is regarded as an embodiment pertaining to a light-emitting device, the length of the conductors in the two-tier stack structure is different for each light-emitting element of the respective sub-pixel.

In Embodiment 3, the heights of the top faces of the conductors 22r, 22g, 22b of the respective sub-pixels are greater than that of the top face of the reflective layer 40. The first electrodes 23 of the sub-pixels R, G, B will be referred to hereafter as first electrodes 23r, 23g, 23b, respectively. Therefore, the shortest distance between the top face of the conductor 22r (surface in contact with the first electrode 23r) and the substrate 10 in the sub-pixel G is equal to or greater than the shortest distance between the optical adjustment layer (first interference film 101) and the substrate 10. The same holds for the sub-pixels B.

FIG. 11A to FIG. 12D schematically illustrate cross-sectional diagrams of steps for forming the organic light-emitting element 3. The method for forming the organic light-emitting element 3 will be explained hereafter in the order of the respective steps.

(1) As illustrated in FIG. 3C, the first interference film 101 and the second interference film 102 are formed on the top face of the interlayer insulating layer 30 in accordance with the same procedure as that of the steps explained with reference to FIG. 3A to FIG. 3C in Embodiment 1.

Figures 11A, 11B:
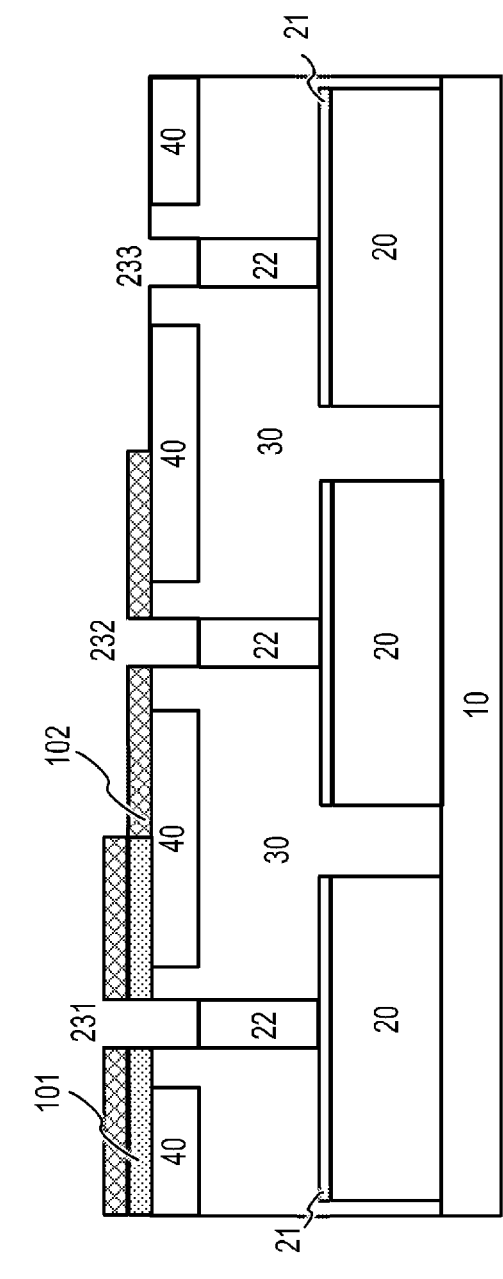
FIG. 11A to FIG. 11D are diagrams for explaining the formation process of the organic light-emitting element according to Embodiment 3.

(2) As illustrated in FIG. 11A, the first interference film 101 and the second interference film 102 are, for instance, etched so that the first interference film 101 and the second interference film 102 are left in the sub-pixel R, and only the second interference film 102 is left in the sub-pixel G.

(3) As illustrated in FIG. 11B, openings 231, 232, 233 are formed at the top of the respective conductors 22 in each sub-pixel. Herein the width of the openings 231, 232, 233 is set to be identical to the width of the conductors 22, with no taper provided in the openings 231, 232, 233.

Figures 11C, 11D:
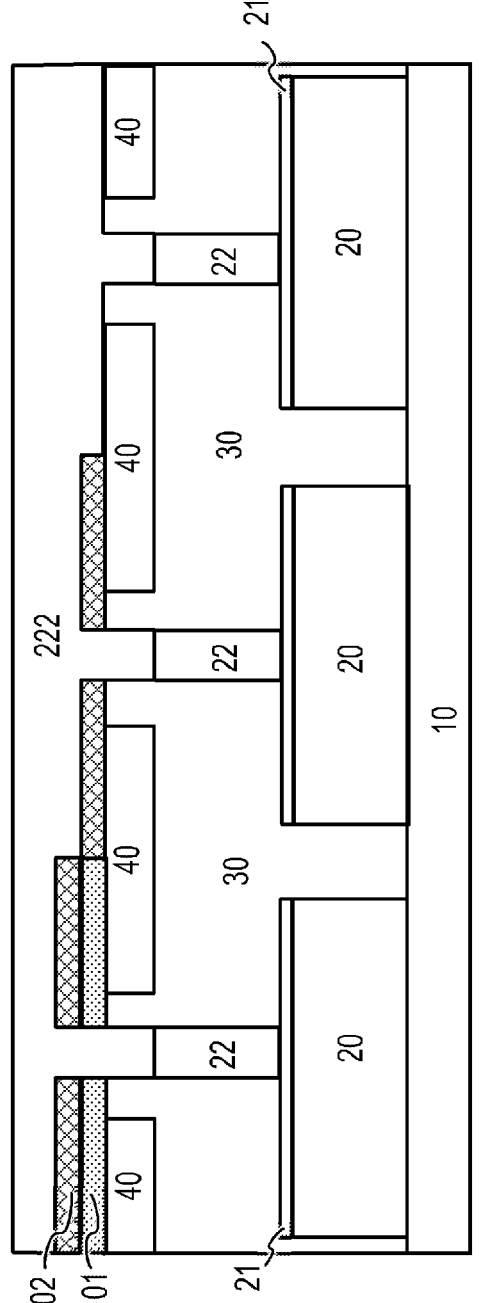

(4) As illustrated in FIG. 11C, tungsten 222 (W) is embedded in the openings 231, 232, 233. At this time the reflective layer 40 and the tungsten 222 in the sub-pixel B are in contact with each other via a barrier metal (not shown).

(5) Upon etch-back the tungsten 222 and the barrier metal (not shown), the conductors 22r, 22g, 22b of different depth (length) corresponding to the respective sub-pixels become formed on the respective conductors 22 of the sub-pixels, as illustrated in FIG. 11D.

Figure 12A:
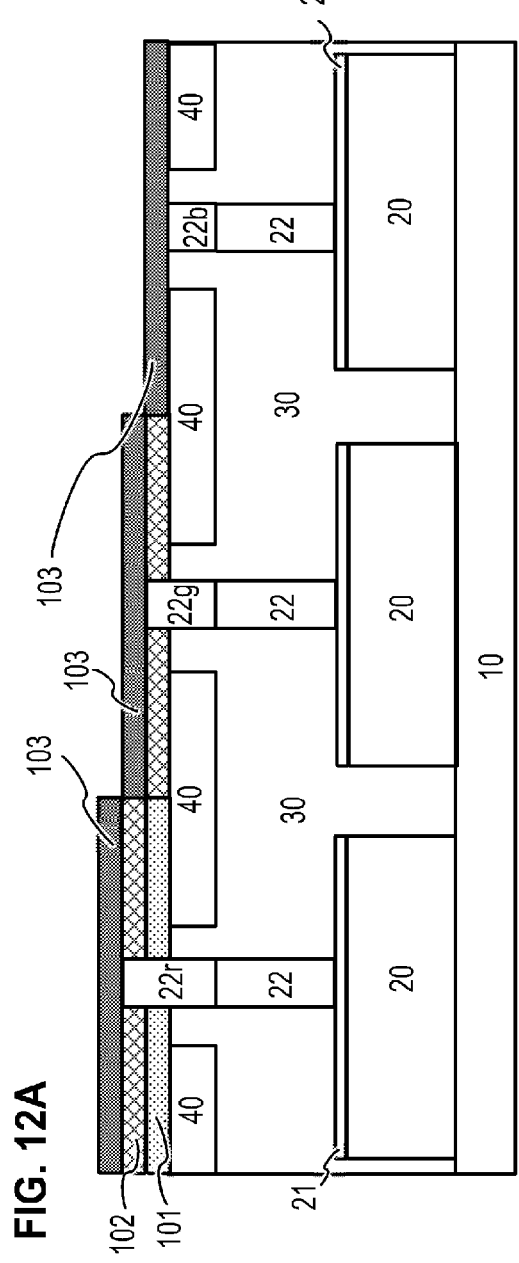

(6) An interference film structure corresponding to the sub-pixels is formed then through formation of the third interference film 103, as illustrated in FIG. 12A.

Figure 12B:
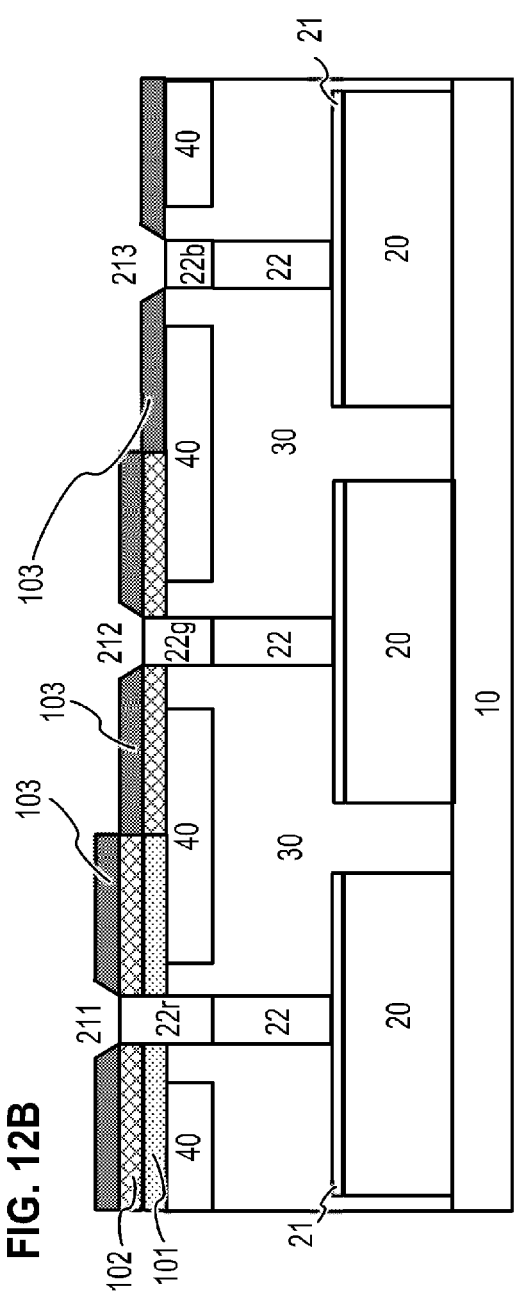

(7) The openings 211, 212, 213 connected to the respective first electrodes 23 of the sub-pixels are formed, as illustrated in FIG. 12B. At this time, the depth of the openings 211, 212, 213 is identical to the thickness of the third interference film 103, and is smaller than that of the openings 211, 212, 213 according to Embodiments 1 and 2. This is advantageous in terms of forming the first electrodes 23 by sputter deposition in a subsequent step.

(8) The first electrodes 23r, 23g, 23b are formed as illustrated in FIG. 12C, after which the bank insulating film 111 is formed as illustrated in FIG. 12D. Similarly to Embodiment 1, the organic light-emitting element 3 according to Embodiment 3 becomes formed upon formation of the organic compound layer 50, the second electrode 60 and the protective layer 70.

The level differences on the surfaces of the first electrodes 23 (anode contact portion) for each sub-pixel are identical, and accordingly, the surfaces can be made substantially flat, at the bank insulating film 111 and the first electrodes 23, through appropriate selection of the thickness of the bank insulating film 111. This is advantageous from the viewpoint of preventing leakage between the anode and the cathode in the contact region.

Figure 13:
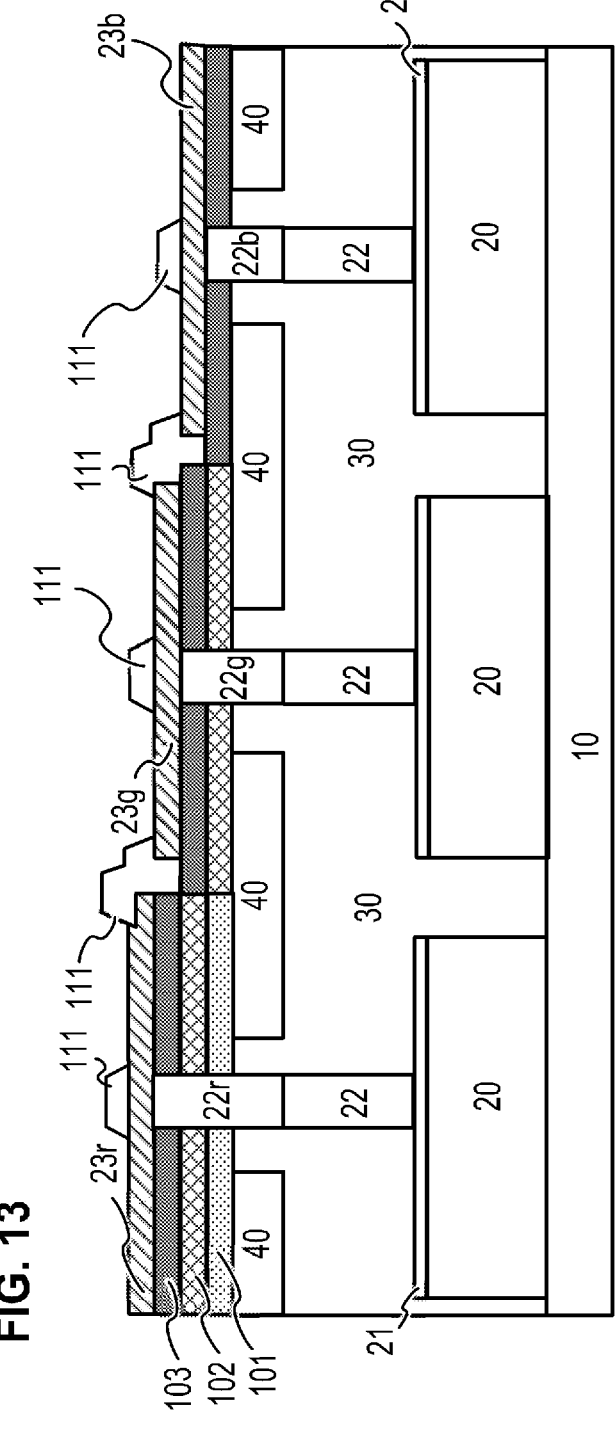
FIG. 13 is a cross-sectional diagram of an organic light-emitting element according to a comparative example.
Figure 14:
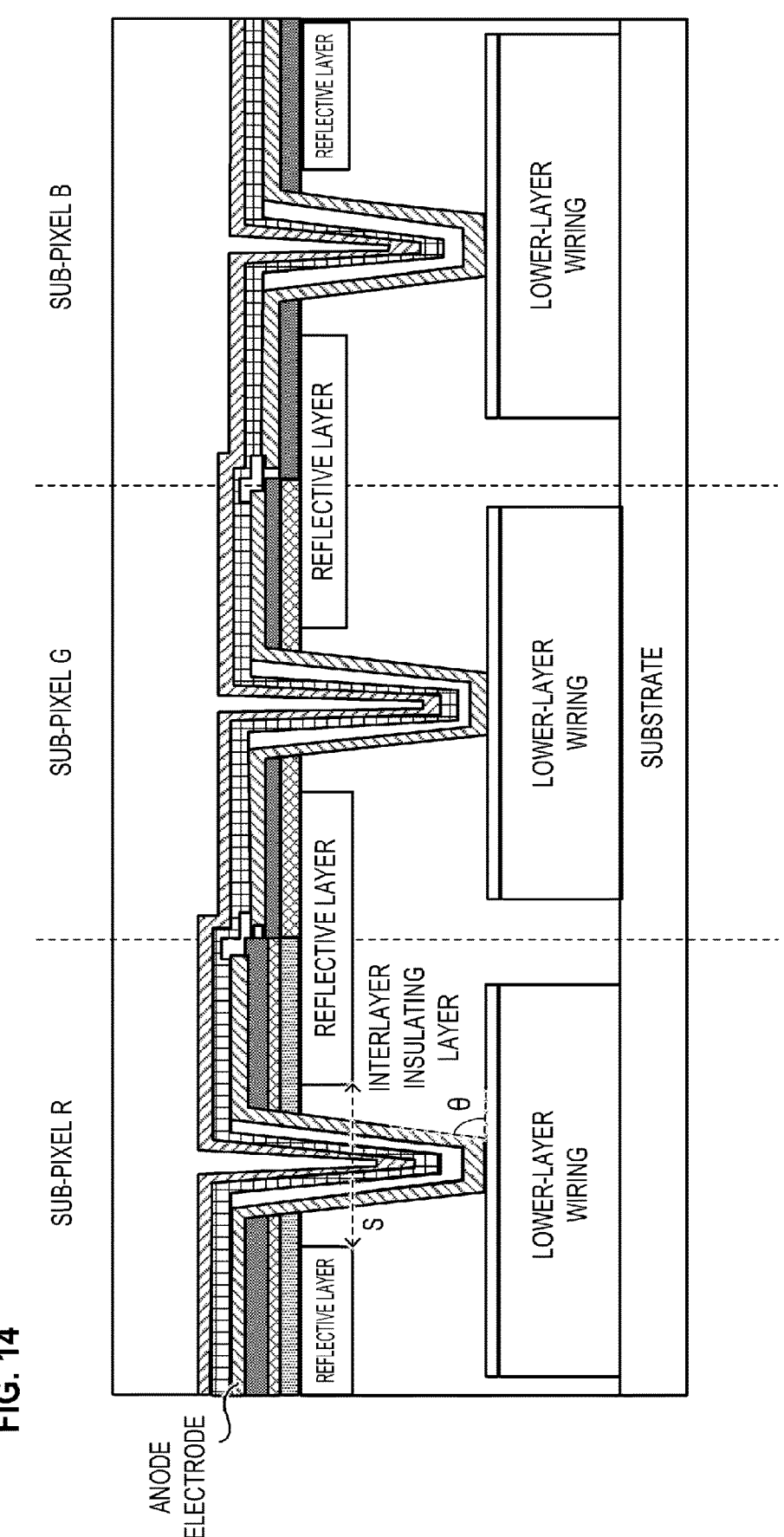
FIG. 14 is a cross-sectional diagram of a conventional organic light-emitting element.

In a hypothetical case where, by contrast, the first electrodes 23r, 23g, 23b are flat, as illustrated in FIG. 13, the bank insulating film 111 bulges out at each contact region, which can give rise to anode-cathode leakage.

If the conductors 22r, 22g, 22r are completely filled with W (tungsten), the bank insulating film is unnecessary, but in that case there usually remain gaps referred to as "seams". The appearance of such "seams" on the surface of the conductor gives rise to anode-cathode leakage. In Embodiment 3, therefore, the bank insulating film 111 covers the top of the conductors 22r, 22g, 22r, to thereby prevent anode-cathode leakage.

In Embodiment 3, the heights of the top faces of the conductors 22r, 22g, 22b of the respective sub-pixels are greater than that of the top face of the reflective layer 40. In consequence, the recessed regions of the first electrodes 23 can be made shallower than those in Embodiments 1 and 2. Therefore, the recessed region of the first electrodes 23 and the opening width (diameter) of the reflective layer 40 can be further narrowed, and hence the size of the organic light-emitting element can be further reduced.

Embodiment 4

Hereafter Embodiment 4 will be explained in which the organic light-emitting element according to any one of Embodiments 1 to 3 is applied to various devices.

Figure 15:
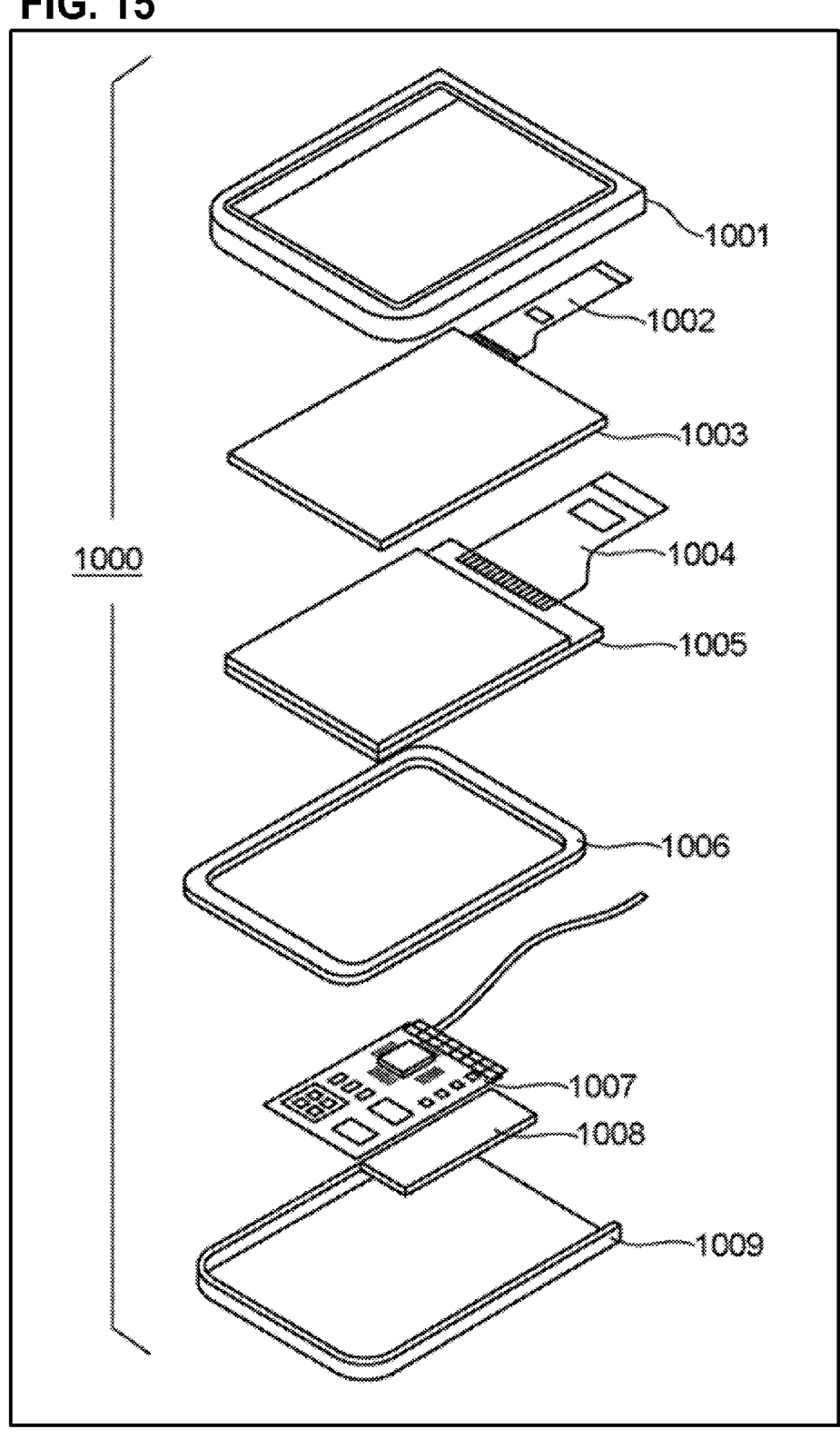
FIG. 15 is a schematic diagram illustrating an example of a display device according to Embodiment 4.

FIG. 15 is a schematic diagram illustrating an example of a display device according to the present embodiment. A display device 1000 may have a touch panel 1003, a display panel 1005, a frame 1006, a circuit board 1007 and a battery 1008, between an upper cover 1001 and a lower cover 1009. Flexible printed circuit FPCs 1002, 1004 are connected to the touch panel 1003 and the display panel 1005. Transistors are printed on the circuit board 1007. The battery 1008 may be omitted if the display device is not a portable device; even if the display device is a portable device, the battery may be provided at a different position.

The display device according to the present embodiment may have red, green and blue color filters. The red, green and blue color filters may be disposed in a delta array.

The display device according to the present embodiment may be used in a display unit of a mobile terminal. In that case the display device may have both a display function and an operation function. Examples of the mobile terminal include mobile phones such as smartphones, as well as tablets and head-mounted displays.

The display device according to the present embodiment may be used in a display unit of an imaging device that has an optical unit (optical member) having a plurality of lenses, and an imaging element that receives light having passed through the optical unit. The imaging element may have a display unit that displays information acquired by the imaging device. The display unit may be a display unit exposed outside the imaging device, or a display unit disposed within a finder. The imaging device may be a digital camera, a digital video camera or the like.

Figure 16A:
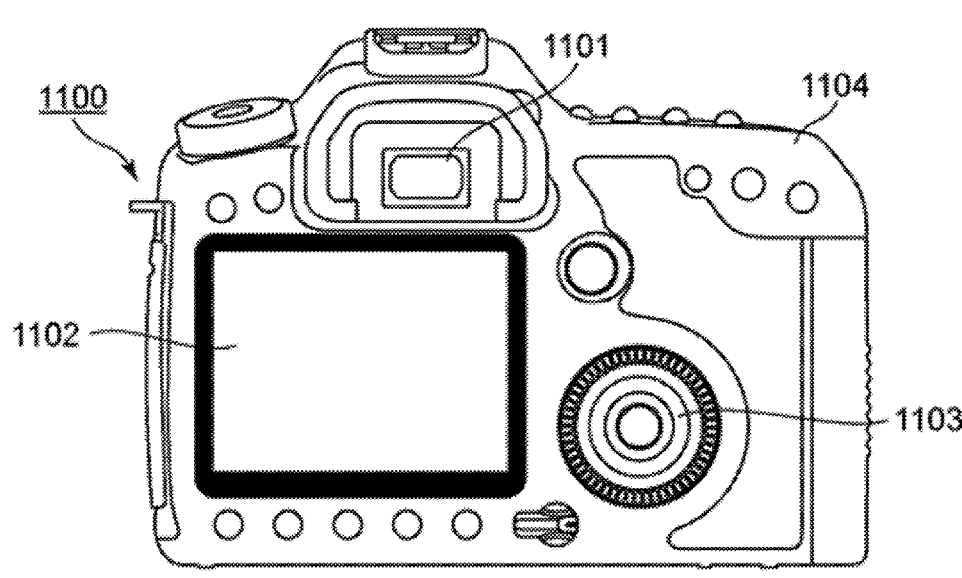
FIG. 16A is a schematic diagram illustrating an example of an imaging device according to Embodiment 4.

FIG. 16A is a schematic diagram illustrating an example of an imaging device according to the present embodiment. An imaging device 1100 may include a view finder 1101, a rear display 1102, an operating unit 1103 and a housing 1104. The view finder 1101 may have the display device according to the present embodiment. In that case the display device may display not only images to be captured, but also environment information, imaging instructions and so forth. The environment information may be, for instance, the intensity of external light, the orientation of external light, the speed with which a subject is moving, or the chance that the subject is hidden by an obstruction.

Timings suitable for imaging are short, and thus information should be displayed as soon as possible. Therefore, it is preferable to use a display device that uses the organic light-emitting element according to any one of Embodiments 1 to 3. This is because the organic light-emitting element has a high response speed. Given the need for display speed, a display device that utilizes an organic light-emitting element can be more preferably used than a liquid crystal display device.

The imaging device 1100 has an optical unit not shown. The optical unit has a plurality of lenses and forms an image on an imaging element that is accommodated in the housing 1104. Focus can be adjusted through adjustment of the relative positions of the plurality of lenses. This operation can also be performed automatically. The imaging device may be called a photoelectric conversion device. As an imaging method in the photoelectric conversion device there can be adopted, instead of sequential imaging, for instance, a method of detecting differences relative to a previous image, or a method of cutting out part of a recorded image or the like.

Figure 16B:
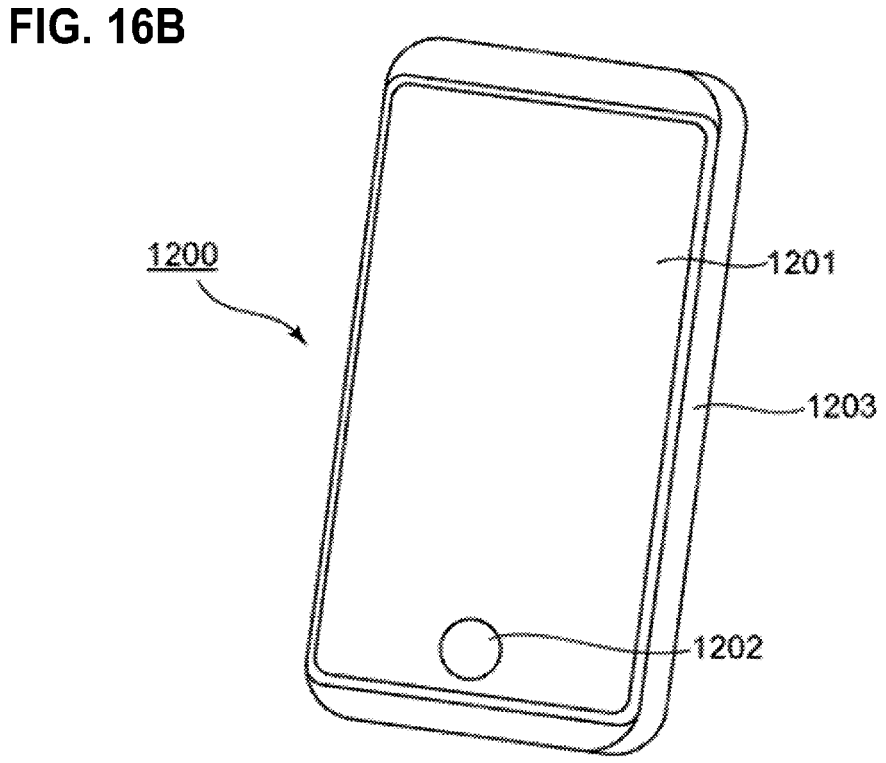
FIG. 16B is a schematic diagram illustrating an example of an electronic device according to Embodiment 4.

FIG. 16B is a schematic diagram illustrating an example of an electronic device according to the present embodiment. An electronic device 1200 has a display unit 1201, an operating unit 1202 and a housing 1203. The housing 1203 may include a circuit, a printed board having the circuit, a battery, and a communication unit. The operating unit 1202 may be a button or a touch panel-type reaction unit. The operating unit may be a biometric recognition unit that, for instance, unlocks a lock upon recognition of a fingerprint. An electronic device having a communication unit can also be referred to as a communication device. The electronic device may further have a camera function by being provided with a lens and an imaging element. The image captured by the camera function is displayed on the display unit. Examples of the electronic device include smartphones and laptop computers.

Figure 17A:
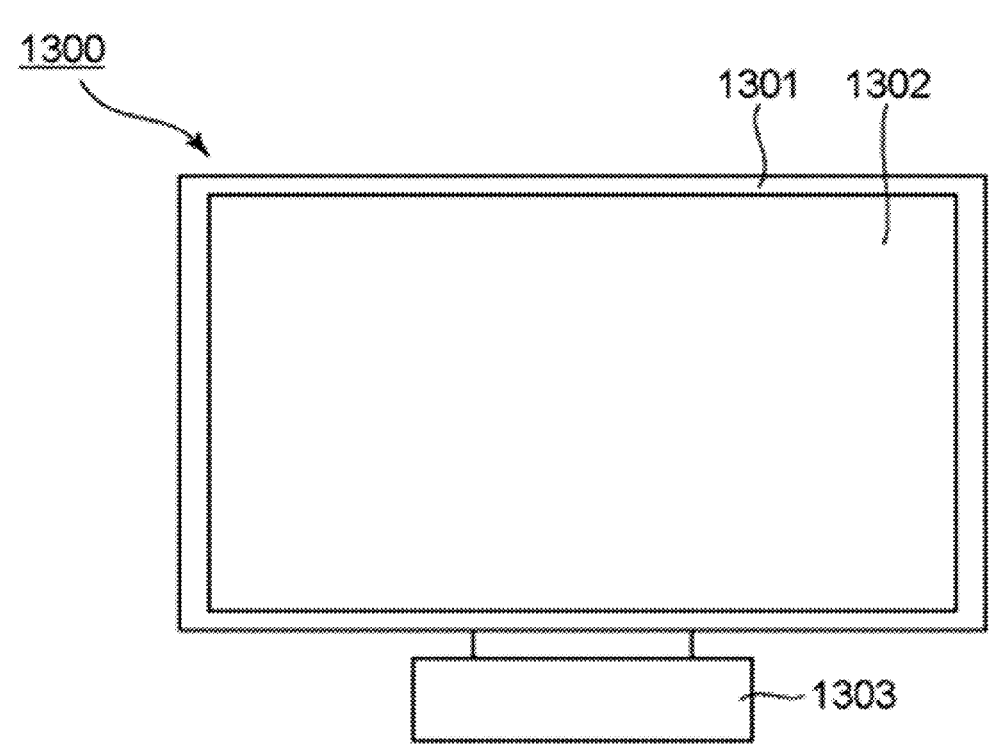
FIG. 17A and FIG. 17B are schematic diagrams illustrating examples of a display device according to Embodiment 4.
Figure 17B:
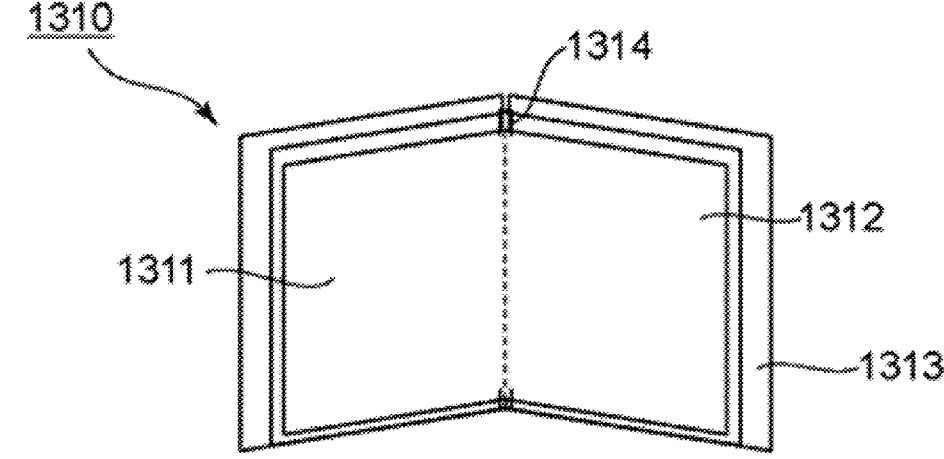

FIG. 17A and FIG. 17B are schematic diagrams illustrating an example of a display device according to the present embodiment. FIG. 17A is a display device such as a television monitor or a PC monitor. A display device 1300 has a display unit 1302 having a frame 1301. The organic light-emitting element of any one of Embodiments 1 to 3 may be used in the display unit 1302.

The display device 1300 has a frame 1301, and a base 1303 that supports the display unit 1302. The form of the base 1303 is not limited to the form in FIG. 17A. A lower side of the frame 1301 may double as the base 1303.

The frame 1301 and the display unit 1302 may be bent. The radius of curvature may be at least 5000 mm and not more than 6000 mm.

FIG. 17B is a schematic diagram illustrating another example of the display device according to the present embodiment. The display device 1310 of FIG. 17B is a so-called foldable display device configured to be foldable. The display device 1310 has a first display unit 1311, a second display unit 1312, a housing 1313 and bending points 1314. The organic light-emitting element according to any one of Embodiments 1 to 3 may be used in the first display unit 1311 and the second display unit 1312. The first display unit 1311 and the second display unit 1312 may be one single seamless display device. The first display unit 1311 and the second display unit 1312 can be separated at the bending points. The first display unit 1311 and the second display unit 1312 may display respectively different images; alternatively, one image may be displayed across the first display unit 1311 and the second display unit 1312.

Figure 18A:
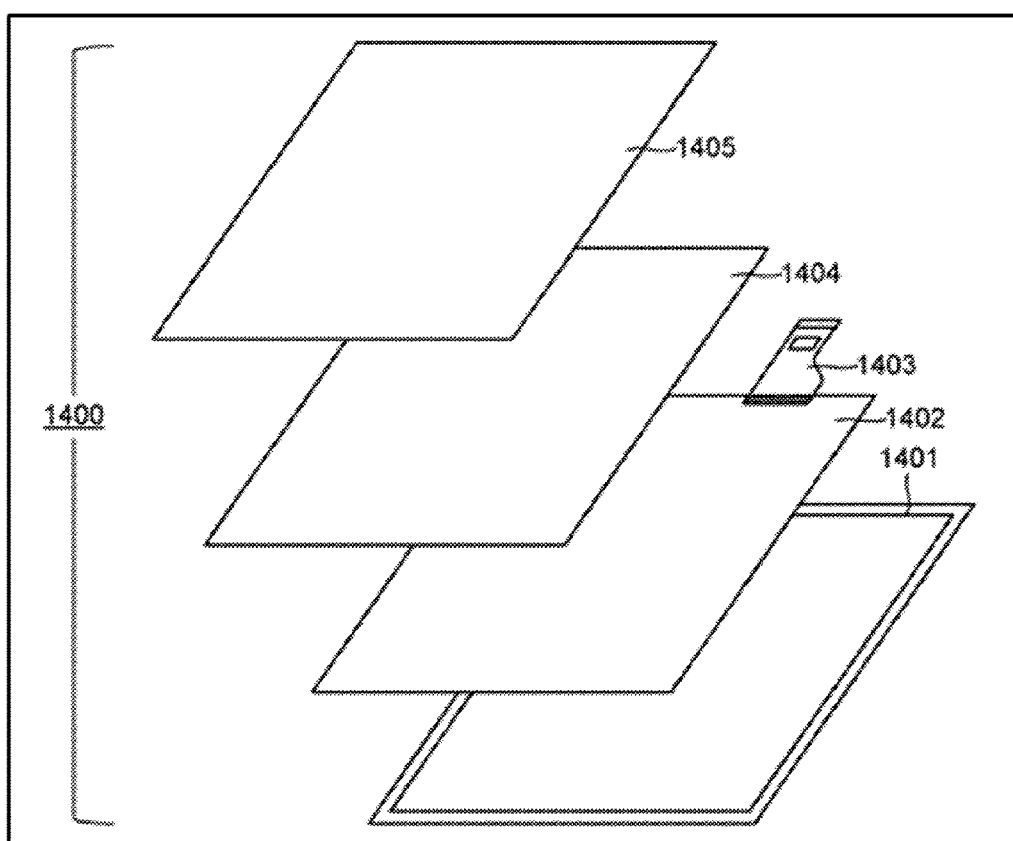
FIG. 18A is a schematic diagram illustrating an example of a lighting device according to Embodiment 4.

FIG. 18A is a schematic diagram illustrating an example of a lighting device according to the present embodiment. The lighting device 1400 may include a housing 1401, a light source 1402, a circuit board 1403, an optical film 1404 and a light diffusing unit 1405. The light source may have the organic light-emitting element according to any one of Embodiments 1 to 3. The optical filter may be a filter that improves a color rendering property of the light source. The light diffusing unit can effectively diffuse the light from the light source, such as exterior decorative lighting, to deliver light over a wide area. The optical film and the light diffusing unit may be provided on the emission side of the lighting device. A cover may be provided on the outermost portion, as needed.

The lighting device is, for instance, a device for indoor illumination. The lighting device may emit white or neutral white, or any another color from blue to red. The lighting device may have a light control circuit for controlling the emitted light of the lighting device. The lighting device may have the organic light-emitting element according to any one of Embodiments 1 to 3 and a power supply circuit connected to the organic light-emitting element. The power supply circuit is a circuit that converts AC voltage into DC voltage. Herein white is a color having a color temperature of 4200K and neutral white is a color having a color temperature of 5000K. The lighting device may have a color filter.

The lighting device according to the present embodiment may have a heat dissipation part. The heat dissipation part dumps heat from within the device to the exterior; examples of the heat dissipation part include metals and liquid silicone of high specific heat capacity.

Figure 18B:
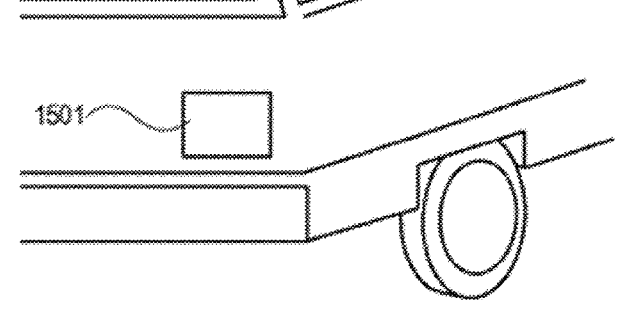
FIG. 18B is a schematic diagram illustrating an example of an automobile according to Embodiment 4.

FIG. 18B is a schematic diagram of an automobile which is an example of a moving body according to the present embodiment. The automobile has a tail lamp, which is an example of a lamp. The automobile 1500 may have a tail lamp 1501 of a form such that the tail lamp 1501 is lit up at the time of a braking operation or the like.

The tail lamp 1501 may have an organic light-emitting element according to any one of Embodiments 1 to 3. The tail lamp 1501 may have a protective member that protects the organic EL element. The protective member has high strength to some degree, and may be any material so long as it is transparent; preferably, however, the protective member is made up of polycarbonate or the like. A furandicarboxylic acid derivative, an acrylonitrile derivative or the like may be mixed with the polycarbonate.

The automobile 1500 may have a vehicle body 1503 and a window 1502 attached to the vehicle body 1503. The window may be a transparent display, so long as it is not a window for checking ahead and behind the automobile. The transparent display may be the organic light-emitting element according to any one of Embodiments 1 to 3. In this case constituent materials of the organic light-emitting element, such as electrodes, are made up of transparent members.

The moving body according to the present embodiment may be a ship, an aircraft, a drone or the like. The moving body may have an airframe and a lamp provided on the airframe. The lamp may emit light to indicate the position of the airframe. The lamp has the organic light-emitting element according to any one of Embodiments 1 to 3.

An application example of the above-described display device will be described with reference to FIG. 19A and FIG. 19B. The display device according to the present embodiment can also be applied to wearable devices such as smart glasses, HMDs and smart contact lenses. An imaging display device used in such an application example includes an imaging device capable of photoelectric conversion of visible light, and a display device capable of emitting visible light.

Figure 19A:
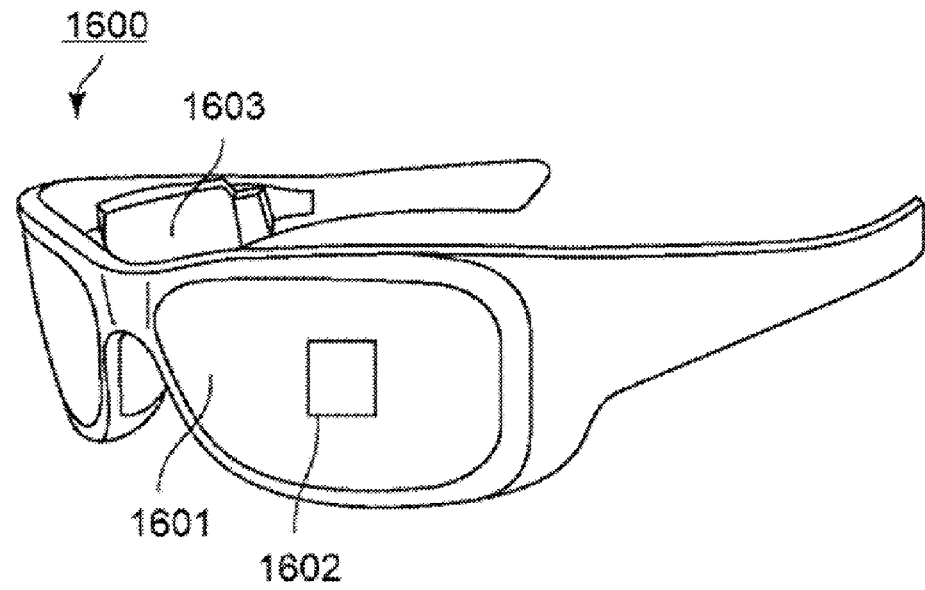
FIG. 19A and FIG. 19B are schematic diagrams illustrating a wearable device according to Embodiment 4.

FIG. 19A explains spectacles 1600 (smart glasses) according to one application example. An imaging device 1602 such as a CMOS sensor or a SPAD is provided on the surface side of a lens 1601 of the spectacles 1600. Further, the above-described display device above is provided on the back surface side of the lens 1601.

The spectacles 1600 further have a control device 1603. The control device 1603 functions as a power source for supplying power to the imaging device 1602 and to the display device according to the present embodiment. The control device 1603 controls the operation of the imaging device 1602 and of the display device. An optical system for condensing light onto the imaging device 1602 is formed in the lens 1601.

Figure 19B:
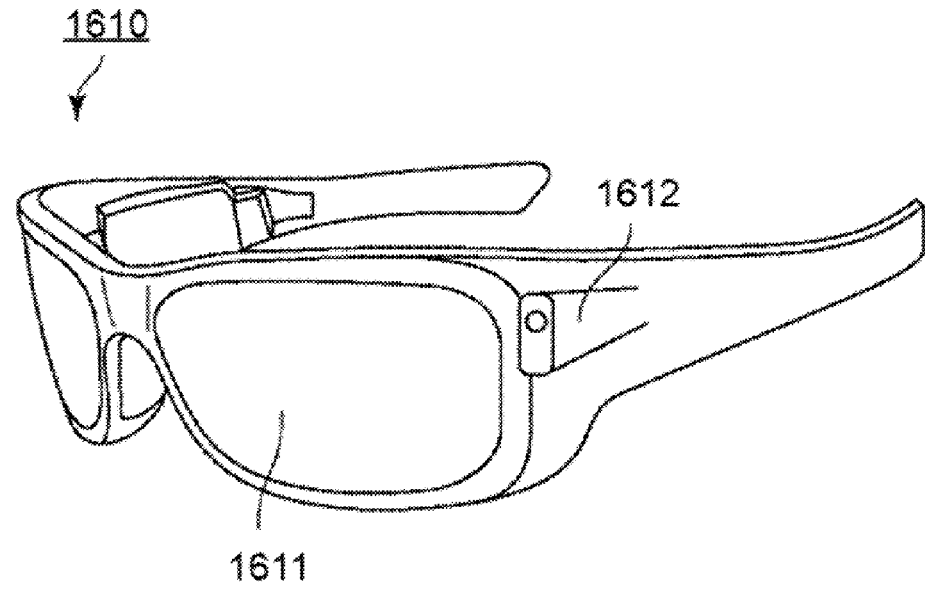

FIG. 19B explains spectacles 1610 (smart glasses) according to one application example. The spectacles 1610 have a control device 1612; herein an imaging device corresponding to the imaging device 1602, and a display device, are mounted on the control device 1612. In the lens 1611 there are formed an imaging device within the control device 1612, and an optical system for projecting the light emitted from the display device, such that an image is projected on the lens 1611. The control device 1612 functions as a power source for supplying power to the imaging device and to the display device, and controls the operation of the imaging device and of the display device. The control device may have a line-of-sight detection unit that detects the line of sight of the wearer. Infrared rays may be used for detecting the line of sight. An infrared emitting unit emits infrared light towards the eyeball of the user who is gazing at the displayed image. An imaging unit having a light-receiving element detects light, reflected by the eyeball, of the emitted infrared light, and a captured image of the eyeball is obtained as a result. Deterioration of the appearance of the image is reduced thanks to the presence of a reducing means for reducing the light from the infrared emitting unit to the display portion in a plan view.

The line of sight of the user aiming at the display image is detected on the basis of the captured image of the eyeball obtained through capture using infrared light. Any known method can be utilized for line-of-sight detection using a captured image of the eyeball. As an example, a line-of-sight detection method based on a Purkinje image derived from reflection of irradiation light on the cornea can be used herein.

More specifically, there is carried out a line-of-sight detection process based on a pupil center-corneal reflection method. The line of sight of the user is detected through calculation of a line-of-sight vector representing the orientation (rotation angle) of the eyeball, on the basis of a pupil image and a Purkinje image included in the captured image of the eyeball, in accordance with a pupil center-corneal reflection method.

The display device according to one embodiment has an imaging device having a light-receiving element, and may control the display image on the display device on the basis of information about the line of sight of the user from the imaging device.

In the display device, specifically, a first visual field area gazed upon by the user and a second visual field area other than the first visual field area are determined on the basis of line-of-sight information. The first visual field area and the second visual field area may be determined by the control device of the display device; alternatively, there may be received a first visual field area and a second visual field area determined by an external control device. The display resolution in the first visual field area may be controlled to be higher than the display resolution in the second visual field area, in the display area of the display device. That is, the resolution in the second visual field area may be lower than that in the first visual field area.

Further, the display area may have a first display area and a second display area different from the first display area, such that either the first display area or the second display area is determined to be a high-priority area on the basis of the line-of-sight information. The first display area and the second display area may be determined by the control device of the display device; alternatively, there may be received a first display area and a second display area determined by an external control device. The resolution of the high-priority area may be controlled to be higher than the resolution in areas other than the high-priority area. That is, the resolution in an area of relatively low priority may be set to be low.

Artificial intelligence may be used to determine, for instance, the first visual field area or a high-priority area. This AI may be a model constructed to estimate the angle of the line of sight from the eyeball image, and the distance up to a target object ahead in the line of sight, using training data in the form of the eyeball image and the direction in which the eyeball in the image is actually gazing. An AI program may be in the display device, in the imaging device, or in an external device. In a case where the external device has the AI program, the program is transmitted to the display device via communication.

In the case of display control on the basis of visual recognition detection, the present invention can be preferably applied to smart glasses further having an imaging device that captures exterior images. Smart glasses can display captured external information in real time.

As explained above, stable display can be achieved over long periods of time, with good image quality, by using a device that utilizes an organic light-emitting element according to the present embodiment.

The present invention allows reducing the size of a light-emitting element.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-067695, filed on Apr. 13, 2021, which is hereby incorporated by reference herein in its entirety.

What is claimed is:

1. A light-emitting element including an emission region and a contact region,
    wherein in the emission region, the light-emitting element includes a wiring layer, an interlayer insulating layer, a reflective layer, an optical adjustment layer, a first electrode, a light-emitting layer, and a second electrode, in this order from a substrate side,
    wherein in the contact region, the light-emitting element includes the wiring layer, a conductor, the first electrode, the light-emitting layer, and the second electrode, in this order from the substrate side,
    wherein the conductor is electrically connected to both the first electrode and the wiring layer,
    wherein a top surface of the first electrode has a recessed region in the contact region,
    wherein a shortest distance between the substrate and the first electrode in the contact region is equal to or greater than a shortest distance between the substrate and the reflective layer in the emission region,
    wherein the interlayer insulating layer has a recessed portion in the emission region,
    wherein the reflective layer is in the recessed portion, and
    wherein a top surface of the reflection layer, a top surface of the interlayer insulating layer, and a top surface of the conductor are continuous.

2. The light-emitting element of claim 1, wherein the conductor has a plug shape.

3. The light-emitting element of claim 1, wherein the reflective layer has an opening, and
    wherein the contact region is included in the opening, in a plan view of the substrate.

4. The light-emitting element of claim 1, wherein the reflective layer is formed of a first metal, and
    wherein the conductor is formed of a second metal different from the first metal.

5. The light-emitting element of claim 1, wherein the first electrode and the conductor are in physical contact,
    wherein the first electrode is formed of indium tin oxide, and
    wherein the conductor is formed of a metal including tungsten.

6. The light-emitting element of claim 1, wherein the reflective layer is formed of a metal including aluminum.

7. The light-emitting element of claim 1, wherein the wiring layer is formed of a metal including aluminum.

8. The light-emitting element of claim 1, wherein an insulating layer is disposed between the first electrode and the light-emitting layer, in the contact region.

9. The light-emitting element of claim 1, wherein a distance between (a) a surface in contact with the first electrode, among surfaces of the conductor in the contact region and (b) the substrate is shorter than a distance between the first electrode in the emission region and the substrate.

10. The light-emitting element of claim 1, wherein an insulating layer is disposed at an end of the emission region, and
    wherein an angle between an outer wall of the recessed region of the first electrode in the contact region and a main surface of the substrate is smaller than an angle between a side face of an insulating layer disposed at an end of the emission region and the main surface of the substrate.

11. A light-emitting device including a plurality of sub-pixels disposed on a substrate,
    wherein each of the plurality of sub-pixels includes the light-emitting element of claim 1,
    wherein the plurality of sub-pixels includes a first sub-pixel and a second sub-pixel, and
    wherein a length of the conductor of the light-emitting element of the first sub-pixel in a direction perpendicular to a main surface of the substrate is different from a length of the conductor of the light-emitting element of the second sub-pixel in the direction perpendicular to the main surface of the substrate.

12. The light-emitting device of claim 11, wherein a first conductor and a second conductor are stacked in the conductor, and
    wherein a length of the second conductor of the light-emitting element of the first sub-pixel in the direction perpendicular to the main surface of the substrate is different from a length of the second conductor of the light-emitting element of the second sub-pixel in the direction perpendicular to the main surface of the substrate.

13. The light-emitting device of claim 12, wherein a shortest distance between (a) the substrate and (b) a surface in contact with the first electrode, among surfaces of the second conductor, is equal to or greater than a shortest distance between the optical adjustment layer and the substrate.

14. A photoelectric conversion device comprising:
    an optical member including a plurality of lenses;
    an imaging element that receives light having passed through the optical member; and
    a display that displays an image captured by the imaging element,
    wherein the display includes the light-emitting element of claim 1.

15. An electronic device comprising:
    a display including the light-emitting element of claim 1;
    a housing in which the display is provided; and
    a communication device, which is provided in the housing, and which performs external communication.

16. The light-emitting element of claim 1, wherein the optical adjustment layer comprises an insulating material.

17. The light-emitting element of claim 1, wherein the conductor is not electrically connected to the reflective layer.

18. A light-emitting element including an emission region and a contact region,
    wherein in the emission region, the light-emitting element includes a wiring layer, an interlayer insulating layer, a reflective layer, an optical adjustment layer, a first electrode, a light-emitting layer, and a second electrode, in this order from a substrate side, wherein in the contact region, the light-emitting element includes the wiring layer, a conductor, the first electrode, the light-emitting layer, and the second electrode, in this order from the substrate side, wherein the conductor is electrically connected to both the first electrode and the wiring layer, wherein a top surface of the first electrode has a recessed region in the contact region, wherein an area of the conductor is smaller than an area of the wiring layer, in a plan view of the substrate, wherein the interlayer insulating layer has a recessed portion in the emission region, wherein the reflective layer is in the recessed portion, and wherein a top surface of the reflection layer, a top surface of the interlayer insulating layer, and a top surface of the conductor are continuous.

\* \* \* \* \*